US009564765B2

(12) United States Patent
Fukute et al.

(10) Patent No.: US 9,564,765 B2
(45) Date of Patent: Feb. 7, 2017

(54) SEMICONDUCTOR DEVICE AND BATTERY VOLTAGE MONITORING DEVICE

(75) Inventors: Akiko Fukute, Kanagawa (JP);
Ryosuke Enomoto, Kanagawa (JP);
Junko Kimura, Kanagawa (JP);
Toshitaka Ukai, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 138 days.

(21) Appl. No.: 14/426,753

(22) PCT Filed: Sep. 10, 2012

(86) PCT No.: PCT/JP2012/073045
§ 371 (c)(1),
(2), (4) Date: Mar. 8, 2015

(87) PCT Pub. No.: WO2014/038081
PCT Pub. Date: Mar. 13, 2014

(65) Prior Publication Data
US 2015/0270727 A1    Sep. 24, 2015

(51) Int. Cl.
*H02J 7/00*     (2006.01)
*G01R 31/36*    (2006.01)
*B60L 3/00*     (2006.01)
*B60L 11/18*    (2006.01)
*H01M 10/48*    (2006.01)
*H04Q 9/00*     (2006.01)

(52) U.S. Cl.
CPC ............ *H02J 7/0042* (2013.01); *B60L 3/0046* (2013.01); *B60L 11/1864* (2013.01);
(Continued)

(58) Field of Classification Search
CPC ....... H02J 7/0042; H02J 7/0052; H02J 7/0063
(Continued)

(56) References Cited

U.S. PATENT DOCUMENTS

| 4,047,158 A * | 9/1977 | Jennings ................. G06F 3/153 |
| | | 358/1.11 |
| 4,570,217 A * | 2/1986 | Allen ....................... G06F 1/14 |
| | | 700/83 |

(Continued)

FOREIGN PATENT DOCUMENTS

| EP | 2 043 220 A2 | 4/2009 |
| JP | 05-165758 A | 7/1993 |

(Continued)

OTHER PUBLICATIONS

Extended European search report for European Patent Application No. 12884301.8, Mar. 17, 2016.

*Primary Examiner* — M'Baye Diao
(74) *Attorney, Agent, or Firm* — Shapiro, Gabor and Rosenberger, PLLC

(57) ABSTRACT

In battery voltage monitoring ICs for measuring voltages of unit cells of an assembled battery, communication with a system control unit is realized in consideration of fail-safe. The system control unit and the battery voltage monitoring ICs are coupled to each other by a communication path using a daisy chain. Each battery voltage monitoring IC has a placement setting pin designating, by a binary code, a unit cell group to which the IC is coupled, in the unit cell groups. When it is detected that the Hamming distance between the code indicative of coupling to a group of the highest potential or a group of the lowest potential and a state actually set in the placement setting pin is 1, some failure such as line disconnection, short-circuit, or the like in the placement setting pins is detected, and the communication path is interrupted.

20 Claims, 14 Drawing Sheets

(52) U.S. Cl.
CPC ...... *G01R 31/3658* (2013.01); *H01M 10/482* (2013.01); *H02J 7/0052* (2013.01); *H02J 7/0063* (2013.01); *H04Q 9/00* (2013.01); *H04Q 2209/10* (2013.01); *H04Q 2209/30* (2013.01); *H04Q 2209/883* (2013.01); *Y02T 10/7005* (2013.01); *Y02T 10/7061* (2013.01); *Y02T 90/16* (2013.01)

(58) Field of Classification Search
USPC ........................................ 320/107, 128, 137
See application file for complete search history.

(56) References Cited

U.S. PATENT DOCUMENTS

| | | | |
|---|---|---|---|
| 6,332,159 B1* | 12/2001 | Hatae | H04L 12/40078 709/220 |
| 6,459,648 B1 | 10/2002 | Hogan et al. | |
| 7,492,210 B2* | 2/2009 | Imai | H03K 17/005 327/407 |
| 9,041,358 B2* | 5/2015 | Kato | H02J 7/0029 320/128 |
| 9,209,113 B2* | 12/2015 | Komatsu | H01L 23/4952 |
| 2013/0066572 A1 | 3/2013 | Terashima et al. | |
| 2013/0181513 A1 | 7/2013 | Yano | |

FOREIGN PATENT DOCUMENTS

| | | |
|---|---|---|
| JP | 2002-110259 A | 4/2002 |
| JP | 2003-178595 A | 6/2003 |
| JP | 3581825 B2 | 10/2004 |
| JP | 2009-072053 A | 4/2009 |
| JP | 2011-182558 A | 9/2011 |
| WO | WO 2011/108201 A1 | 9/2011 |
| WO | WO 2012/043592 A1 | 4/2012 |

* cited by examiner

NOTE: HD STANDS FOR HAMMING DISTANCE

Fig.6

| MONITORING IC | ADDRESS SETTING TERMINAL | | | | | ADDRESS REGISTER | CHIP ADDRESS FRAME (IN THE CASAE OF DESIGNATING ONLY 1 IC) |
|---|---|---|---|---|---|---|---|
| | A4 | A3 | A2 | A1 | A0 | | |
| HIGHEST-ORDER | 1 | 1 | a | b | c | b'11abc | DEPENDING ON THE NUMBER OF STACKS |
| LOWEST-ORDER | 1 | 0 | 1 | 1 | 1 | b'11111 | b'0111111111111111 |
| INTERMEDIATE-ORDER | 0 | 0 | a | b | c | b'11abc | DEPENDING ON THE NUMBER OF STACKS |
| SINGLE USE | 0 | 1 | 1 | 1 | 1 | b'***** | — |

NOTE: a, b, AND c DEPEND ON THE NUMBER OF STACKS (a) METHOD OF SETTING ADDRESS SETTING TERMINAL

| MONITORING IC | ADDRESS SETTING TERMINAL | | | | | ADDRESS REGISTER | CHIP ADDRESS FRAME (IN THE CASAE OF DESIGNATING ONLY 1 IC) |
|---|---|---|---|---|---|---|---|
| | A4 | A3 | A2 | A1 | A0 | | |
| IC8 (HIGHEST-ORDER) | 1 | 1 | 0 | 0 | 0 | b'11000 | b'1111111011111111 |
| IC7 (INTERMEDIATE-ORDER) | 0 | 0 | 0 | 0 | 1 | b'11001 | b'1111110111111111 |
| IC6 (INTERMEDIATE-ORDER) | 0 | 0 | 0 | 1 | 0 | b'11010 | b'1111101111111111 |
| IC5 (INTERMEDIATE-ORDER) | 0 | 0 | 0 | 1 | 1 | b'11011 | b'1111011111111111 |
| IC4 (INTERMEDIATE-ORDER) | 0 | 0 | 1 | 0 | 0 | b'11100 | b'1110111111111111 |
| IC3 (INTERMEDIATE-ORDER) | 0 | 0 | 1 | 0 | 1 | b'11101 | b'1101111111111111 |
| IC2 (INTERMEDIATE-ORDER) | 0 | 0 | 1 | 1 | 0 | b'11110 | b'1011111111111111 |
| IC1 (LOWEST-ORDER) | 1 | 0 | 1 | 1 | 1 | b'11111 | b'0111111111111111 |

(b) METHOD OF SETTING ADDRESS SETTING TERMINAL (IN THE CASE OF 8 STACKS)

NOTE: HD STANDS FOR HAMMING DISTANCE

Fig.8

| MONITORING IC | MODE SETTING TERMINAL | | | ADDRESS REGISTER | CHIP ADDRESS FRAME (IN THE CASE OF DESIGNATING ONLY 1 IC) |
|---|---|---|---|---|---|
| | mode2 | mode1 | mode0 | | |
| HIGHEST-ORDER | 1 | 1 | 0 | b'1abcd | DEPENDING ON THE NUMBER OF STACKS |
| LOWEST-ORDER | 1 | 0 | 1 | b'11111 | b'01111111 11111111 |
| INTERMEDIATE-ORDER | 0 | 0 | 0 | b'1abcd | b'******** ******** |
| SINGLE USE | 0 | 1 | 1 | b'***** | — |

NOTE: a, b, AND c DEPEND ON THE NUMBER OF STACKS (a) METHOD OF SETTING ADDRESS SETTING TERMINAL

| MONITORING IC | MODE SETTING TERMINAL | | | ADDRESS REGISTER | CHIP ADDRESS FRAME (IN THE CASAE OF DESIGNATING ONLY 1 IC) |
|---|---|---|---|---|---|
| | mode2 | mode1 | mode0 | | |
| IC16(HIGHEST-ORDER) | 1 | 1 | 0 | b'10000 | b'1111111111111110 |
| IC15 (INTERMEDIATE-ORDER) | 0 | 0 | 0 | b'10001 | b'1111111111111101 |
| IC14 (INTERMEDIATE-ORDER) | 0 | 0 | 0 | b'10010 | b'1111111111111011 |
| IC13 (INTERMEDIATE-ORDER) | 0 | 0 | 0 | b'10011 | b'1111111111110111 |
| IC12 (INTERMEDIATE-ORDER) | 0 | 0 | 0 | b'10100 | b'1111111111101111 |
| IC11 (INTERMEDIATE-ORDER) | 0 | 0 | 0 | b'10101 | b'1111111111011111 |
| IC10 (INTERMEDIATE-ORDER) | 0 | 0 | 0 | b'10110 | b'1111111110111111 |
| IC9 (INTERMEDIATE-ORDER) | 0 | 0 | 0 | b'10111 | b'1111111101111111 |
| IC8 (INTERMEDIATE-ORDER) | 0 | 0 | 0 | b'11000 | b'1111111011111111 |
| IC7 (INTERMEDIATE-ORDER) | 0 | 0 | 0 | b'11001 | b'1111110111111111 |
| IC6 (INTERMEDIATE-ORDER) | 0 | 0 | 0 | b'11010 | b'1111101111111111 |
| IC5 (INTERMEDIATE-ORDER) | 0 | 0 | 0 | b'11011 | b'1111011111111111 |
| IC4 (INTERMEDIATE-ORDER) | 0 | 0 | 0 | b'11100 | b'1110111111111111 |
| IC3 (INTERMEDIATE-ORDER) | 0 | 0 | 0 | b'11101 | b'1101111111111111 |
| IC2 (INTERMEDIATE-ORDER) | 0 | 0 | 0 | b'11110 | b'1011111111111111 |
| IC1(LOWEST-ORDER) | 1 | 0 | 1 | b'11111 | b'0111111111111111 |

(b) METHOD OF SETTING ADDRESS SETTING TERMINAL(IN THE CASE OF 16 STACKS)

SEMICONDUCTOR DEVICE AND BATTERY VOLTAGE MONITORING DEVICE

TECHNICAL FIELD

The present invention relates to a battery voltage monitoring device and a semiconductor device used for the same and, more particularly, relates to a technique effectively applied to fail-safe design in communication of a battery voltage monitoring IC (Integrated Circuit).

BACKGROUND ART

At present, an electric vehicle using a motor as a drive source for vehicle travel is being developed by not only automobile makers but also many companies and organizations. To drive a motor, an in-vehicle power supply having high voltage of hundreds volts is necessary. The power supply is realized by a battery system using an assembled battery constructed by coupling a number of battery cells (unit cells) each generating a voltage of a few bolts in series. In such a battery system, states of each battery cell (for example, battery voltage, battery impedance, temperature, charge remaining amount, and the like) have to be monitored in all of use environments at the time of travel of a vehicle, charging, and the like. Since a battery system has a severe risk such as firing or explosion at the time of occurrence of a failure, to safely operate it, state data of battery voltage and the like of each of a plurality of battery cells measured in a voltage measuring device have to be transferred to a system control apparatus and calculated in a real-time manner, and a proper control has to be performed on the basis of the state data.

To monitor the states of each of battery cells, a battery control system is configured. The battery control system is to monitor and control each of the battery cells with high precision. The battery control system is usually constructed by a monitoring IC (Integrated Circuit), a fault monitor IC, an MCU (Micro Controller Unit) operating as a system control unit, and the like.

The monitoring IC monitors the states of a battery cell and outputs state data (mainly, battery voltage). The monitoring IC measures the battery voltage of a battery cell with precision of, for example, about ±5 mV and outputs a measurement result in accordance with an instruction from the MCU. The fault monitor IC monitors the voltage of the battery cell and, in the case where the monitored voltage exceeds predetermined voltage, outputs a signal. For example, the fault monitor IC outputs a signal indicative of an over discharge state in the case where the battery voltage becomes 2V or less and outputs a signal indicative of an overcharge state in the case where the battery voltage becomes 4.5V or higher. The MCU controls the monitoring IC and the fault monitor IC and, on the basis of output results of the monitoring IC and the fault monitor IC, controls the battery control system. The MCU calculates the state data output from the monitoring IC in a real-time manner and performs a proper control on the basis of the state data.

The monitoring IC and the fault monitor IC usually have the function of monitoring a lithium (Li) ion battery in which 12 to 14 cells are coupled in series. A battery monitoring module is constructed by a module substrate on which one monitoring IC, one fault monitor IC, and peripheral elements are mounted and 12 to 14 battery cells coupled in series. Therefore, for example, in the case of a Li ion battery, an output of one battery monitoring module is about 43.2V to 50.4V. Consequently, an assembled battery of hundreds volts is constructed by stacking a plurality of battery monitoring modules. The plurality of (for example, eight) battery monitoring modules stacked are controlled by a single MCU. The MCU controls the battery monitoring modules individually by communication lines coupling the monitoring ICs of the plurality of battery monitoring modules in parallel or in series.

To individually control the battery monitoring modules by the MCU, for example, an address has to be set in each of, for example, eight monitoring ICs stacked. For this purpose, many monitoring ICs have a plurality of pins for setting addresses. By changing coupling (pull-down/pull-up) of the pins, an address is set. For example, in the case of eight monitoring ICs stacked, at least three address setting pins are necessary.

Patent literature 1 discloses an electricity storage system provided with an address recognizing device having an address detection pin to which analog current is supplied and specifying the address of an electricity storage module on the basis of the direction and magnitude of the supplied current. A plurality of electricity storage modules (B1 to B14) each obtained by coupling a plurality of electricity storage cells (E1 to E10) in series or in parallel are coupled in series or in parallel via coupling pins (11a, 12a), an address detection pin (S1) is provided for each of the electricity storage modules, and the address detection pins are mutually coupled. The address detection pins (S1) in the electricity storage modules (B1 to B14) are short-circuited by a cable (6), and the cable (6) is coupled to the ground. With the configuration, the directions of currents flowing from discharge lines (21) into a current detection circuit (23) from the electricity storage module (B1) toward the electricity storage module (B14) become constant. Only by comparing the magnitudes, an address can be specified. In the electricity storage system, according to a signal of an amount of the current of the current detection circuit (23) transmitted from a control circuit (M) via pins (S2 and S3) of a transformer (5) on the basis of a voltage signal received by a microcomputer, addresses are automatically assigned to the electricity storage modules (B1 to B14) by a host computer.

Patent literature 2 discloses an assembled battery in which a plurality of unit cell boards and a battery management unit are coupled by a loop communication path. The unit cell board is provided for each unit cell, digitizes measurement values such as voltage, internal resistance, and temperature of the unit cell, ambient temperature, and the like, holds the values, and transmits them to the battery management unit in accordance with a token-ring communication control protocol. Since the communication path has a loop shape, most of couplings are between the adjacent unit cell boards. Since the potential difference between the adjacent unit cells is not large, the configuration of a level shift circuit is simple.

Patent literature 3 discloses an electricity storage apparatus having master-side control means (23) controlling the electricity storage apparatus and a plurality of slave-side control means (14) monitoring battery voltage. The electricity storage apparatus stores the address of itself which is set by process operations of the master-side control means (23) and each of the slave-side control means (14) into a storage unit, adds the address of itself to a control signal based on the battery voltage detected by a voltage detection circuit (13), and transmits the resultant signal to the master-side control means (23).

The slave-side control means (14) is constructed by, for example, a microcomputer to which a signal of the battery voltage transmitted/received to/from a control unit (1) and another assembled battery (5) via a communication interface circuit (12) and detected by the voltage detection circuit (13). In the case where the battery voltage detected by the voltage detection circuit (13) exceeds a limit voltage value of a secondary cell (3), the slave-side control means (14) recognizes the fact. As will be described later, a control signal as failure information is transmitted with the address which is set to the control unit (1) via the communication interface circuit (12). Consequently, the control unit (1) can specify and recognize the assembled battery having the failure. The slave-side control means (14) has a random-number generating unit (15) for generating a temporary address and a storage unit (16) for storing a set address.

The slave-side control means (14) receives the command, performs a command receiving process (step 50), and determines the kind of the command (step 51). In the case where it is determined by the determination that the command is an address resetting command, a random number of 1 to N or less (N is a predetermined upper limit value and is 255 in this case) is generated by using the random-number generating unit (15) (a random number generation program using battery voltage detection data as a seed) held in the slave-side control means (14), and the random number is set as a temporary self address (step 52) Subsequently, the slave-side control means (14) prepares return data (step 53), counts the temporary address as wait time, performs a process of adjusting return wait time by the employed random number (step 54), performs a process of returning the temporary address, and transmits the temporary address to the master-side control means (23) (step 55). The master-side control means (23) which receives the temporary address transmitted from the slave-side control means (14) performs a process of receiving the temporary address (step 41) and determines whether the number of pieces of valid reception data is the same as the number of kinds of temporary addresses or not (step 42). In the case where the number of pieces of valid reception data and the number of kinds of temporary addresses are not the same in the determination in step 42, the master-side control means (23) returns to step 40, issues an address resetting command, and repeats the operation until the number of pieces of valid reception data and the number of kinds of the temporary address become the same for the following reason. On the side of the master-side control means (23), when all of the slave-side control means (14) have different temporary addresses, the number of pieces of valid reception data and the number of kinds of temporary addresses are supposed to finally become the same. In the case where the number of pieces of valid reception data and the number of kinds of temporary addresses become the same in step 42, the master-side control means (23) determines whether there is overlap in the temporary addresses or not (step 43). In the case where there is overlap in the temporary addresses in the determination, the master-side control means (23) returns to step 40, issues the address resetting command, and repeats the operation until there is no overlap in the temporary addresses. When there is no overlap, on assumption that different address data is distributed to all of the slave-side control means (14), the master-side control means (23) issues an address determination command, and transmits it to all of the slave-side control means (14). The slave-side control means (14) receives the transmitted address determination command, performs a command receiving process (step 50), and determines the kind of the command (step 51). In the case where the command is determined as the address determination command by the determination, the slave-side control means (14) stores the temporary address as the genuine self address of the master-side control means (23) into a storing unit 16 (step 56), and performs the processes in step 53 to step 55. In such a manner, the addresses of the plurality of battery monitoring devices 2 can be automatically determined. By generating a temporary address from the random-number generating unit (15) and performing the process to determine the temporary address as the self address as described above, the self address can be easily set in each of the battery monitoring devices (2).

Patent literature 4 discloses a system having a central processing unit (1) and a plurality of input/output units (2 to 5) coupled by a system bus (6), in which an address is automatically set in the input/output units. The central processing unit (1) and the plurality of input/output units (2 to 5) are coupled by a daisy-chain data line (7). First, an address for automatically setting addresses is set in the system. The address is designated, and the central processing unit (1) transmits the head value of an address to be set to the input/output unit (2) at the first stage in the daisy-chain data line (7). The input/output unit (2) at the first stage sets the received address, adds an address of the amount of the memory of the unit itself, and transmits the head value of an address to be set to the input/output unit (3) at the next stage. By repeating the operation up to the input/output device (5) at the final stage, the addresses of the input/output units (2 to 5) can be mapped.

RELATED ART LITERATURE

Patent Literature

Patent Literature 1: Japanese Unexamined Patent Application Publication No. 2009-072053
Patent Literature 2: Japanese Unexamined Patent Application Publication No. 2011-182558
Patent Literature 3: Japanese Unexamined Patent Application Publication No. 2002-110259
Patent Literature 4: Japanese Unexamined Patent Application Publication No. Hei 05(1993)-165758

DISCLOSURE OF THE INVENTION

Problems that the Invention is to Solve

The present inventors examined the patent literatures 1, 2, 3, and 4 and, as a result, found that there are the following new problems.

By the technique disclosed in the patent literature 1, since it is free from increase in the number of lines and use of a command data statement, increase more than necessary in the size of the electricity storage system and communication time can be prevented. Since it is necessary to continuously pass direct current, the power is always consumed. In addition, since the magnitudes of currents supplied to the unit battery cells are not uniform, it causes loss of a cell balance as the voltage balance of the unit cells configuring the assembled battery. Further, the analog value as current is used, the influence of noise may be incurred. Particularly, in the case of suppressing the current value to suppress the power consumption, the influence of noise is larger.

According to the technique disclosed in the patent literature 2, a number of high-voltage isolators are unnecessary and increase in the number of lines can be suppressed. However, a method of assigning an address to a unit-cell board is not disclosed.

According to the technique disclosed in the patent literature 3, the self address can be set reliably in each of the battery monitoring devices (2). However, a processor such as an MCU has to be provided for also each of the battery monitoring devices (2), so that the burden of the cost is heavy.

According to the technique disclosed in the patent literature 4, an address can be automatically assigned to a slave device coupled by a daisy chain. The technique itself disclosed in the patent literature 4 relates to a data processing system made by a central processing unit and a plurality of input/output units commonly coupled to a system bus, and the case where potentials of the plurality of input/output units are different is not assumed. Even if the system can be combined with the battery monitoring device disclosed in the patent literature 2, fail-safe against a failure such that a set address cannot be correctly read due to a failure is not disclosed and is not even suggested.

As a result of the examination of the present inventors, it was found that there are the following new problems.

To construct the battery monitoring device disclosed in the patent literature 2, the method of coupling the plurality of battery voltage monitoring ICs is an issue. According to the position in which the battery voltage monitoring IC is disposed, that is, a potential tap in the assembled battery to which the battery voltage monitoring IC is coupled, the electric characteristics of the communication signal pin as a component of the daisy chain have to be changed. For example, the electric characteristics of a communication signal pin such as voltage output, current output, voltage input, and current input have to be properly made correspond to the circuit method of a step-up or step-down level shifter, the electric characteristics of an input or output of an isolating element (isolator) such as a photo coupler, and the like. The present inventors found that it is preferable to make the electric characteristics of a communication signal pin of the battery voltage monitoring IC properly switchable depending on the position in which the IC is disposed, that is, the potential tap to which the IC is coupled in the assembled battery for the following reason. It is economically improper to prepare various battery voltage monitoring ICs having communication signal pins of different electric characteristics.

A method of detecting the position in which a battery voltage monitoring IC is disposed, that is, a potential tap in an assembled battery, to which the battery voltage monitoring IC is coupled will be examined. To each of battery voltage monitoring ICs, for communication with an MCU operating as a system control unit, a unique address is assigned. The present inventors found that, by associating the address for the communication with the position in which the battery voltage monitoring IC is disposed and interpreting (decoding) the address, the position of the battery voltage monitoring IC can be detected. By assigning the address 0 to the battery voltage monitoring IC disposed at the lowest potential end and sequentially increasing the address toward the high potential side, the disposition position can be detected. On the basis of it, the electric characteristics of a communication signal pin can be made adapted.

The present inventors also found that when an error occurs in an assigned address due to a failure or the like, the electric characteristics of the communication signal pin of the battery voltage monitoring IC change improperly, communication with a coupled circuit becomes impossible, and in some cases, there is the possibility that a serious accident such as destruction occurs in the battery voltage monitoring IC itself or the coupled circuit. Particularly, in a daisy chain, the electric characteristics of a communication signal pin of the battery voltage monitoring IC disposed at the highest potential end and those of a communication signal pin of the battery voltage monitoring IC disposed at the lowest potential end have to be different from those of a battery voltage monitoring IC disposed therebetween.

There various problems to be solved as described above to realize communication between an MCU operating as a system control unit and a plurality of battery voltage monitoring ICs with the small number of lines while suppressing parts cost and, further, in consideration of a fail-safe without providing a high-function communication interface for each of the battery voltage monitoring ICs and without employing a complicated communication protocol.

Means for solving such problems will be described hereinafter, and the other problems and novel features will become apparent from the description of the specification and the appended drawings.

Means for Solving the Problems

A representative one of the inventions disclosed in the present application will be briefly described as follows.

A battery voltage monitoring device including a plurality of battery voltage monitoring ICs disposed every plural unit cell groups in a plurality of unit cells configuring an assembled battery by being serially coupled in multiple stages and a battery system control unit is constructed as follows.

The battery voltage monitoring ICs are sequentially disposed by unit cell groups of different potentials and are coupled to the battery system control unit by a communication path using daisy chain. The battery voltage monitoring IC has a placement setting pin designating, by a binary code, a unit cell group to which the IC is coupled, in the unit cell groups. When the Hamming distance is 1 where the Hamming distance of the state of the placement setting pin from a code indicating coupling to a unit cell group of the highest potential or a code indicating coupling to a unit cell group of the lowest potential, the battery voltage monitoring IC interrupts the communication using the daisy chain.

Effects of the Invention

An effect obtained by a representative one of the inventions disclosed in the present application will be briefly described as follows.

Communication between an MCU operating as a system control unit and a plurality of battery voltage monitoring ICs can be realized with the small number of lines while suppressing parts cost and, further, in consideration of a fail-safe without providing a high-function communication interface for each of the battery voltage monitoring ICs and without employing a complicated communication protocol.

BRIEF DESCRIPTION OF THE DRAWINGS

FIG. 6 is an explanatory diagram expressing an example of address tables of the battery voltage monitoring IC (pin addressing) according to the first embodiment.

FIG. 8 is an explanatory diagram expressing an example of address tables of a battery voltage monitoring IC (auto addressing) according to the third embodiment.

BEST MODE FOR CARRYING OUT THE INVENTION

1. Summary of the Embodiments

Figure 1:
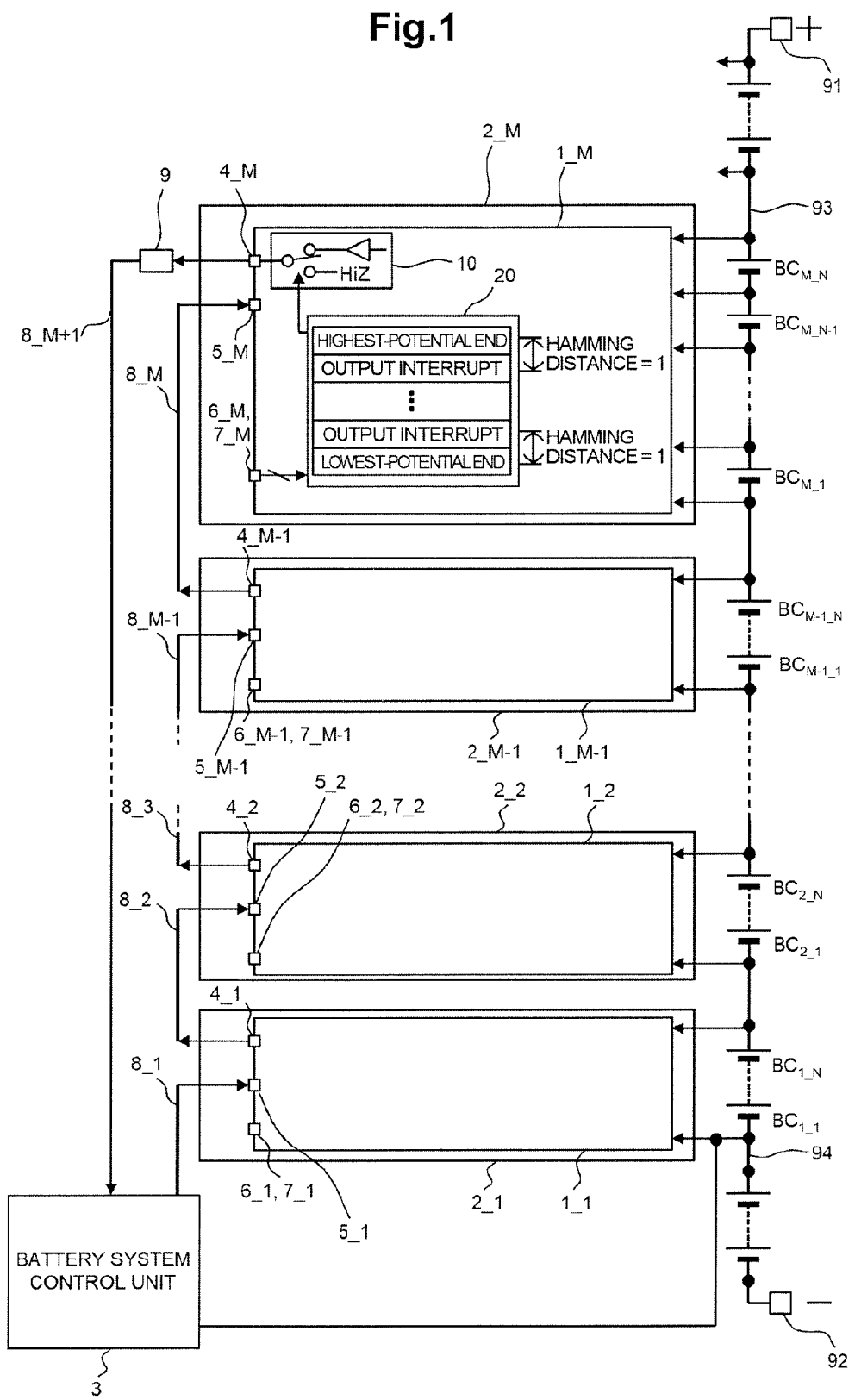
FIG. 1 is a block diagram illustrating a configuration example of a battery voltage monitoring device IC according to a first embodiment and a battery voltage monitoring device in which a battery system control unit and a plurality of battery voltage monitoring ICs are coupled by a daisy chain performing ring network communication.

First, outline of a representative embodiment of the invention disclosed in the present application will be described. Reference numerals in the drawings referred to by attaching parentheses in description of the outline of the representative embodiment merely illustrate what is included in the concept of components to which the reference numerals are designated.

[1] <Detection of Failure in Placement Setting Pin and Interruption of Output>

The present invention relates to a semiconductor device (battery voltage monitoring IC) (1_1 to 1_M) disposed in each of M pieces (M is an integer of three or larger) of unit cell groups in a plurality of unit cells which construct an assembled battery by being serially coupled in multiple stages between a positive electrode (91) and a negative electrode (92), the M pieces of unit cell groups existing from a first tap (93) close to the positive electrode and a second tap (94) close to the negative electrode, and the device for monitoring the unit cells belonging to the group, and the semiconductor device is constructed as follows.

The semiconductor device has: a communication signal pin (4); a placement setting pin group (6, 7) for designating, in a binary code, a unit cell group to which the placement setting pin group is coupled, in the M pieces of unit cell groups; an output switching circuit (10) capable of switching between output and interruption of a signal from the communication signal pin; and a mode determining circuit (20) for controlling the output switching circuit on the basis of a state of the placement setting pin group.

A state of the placement setting pin group for designating coupling to the first tap is expressed by a first code, and a state of the placement setting pin group for designating coupling to the second tap is expressed by a second code.

The mode determining circuit interrupts an output from the communication signal pin by the output switching circuit when the state of the placement setting pin group corresponds to a Hamming distance of 1 from the first code or the second code.

With the configuration, communication between an MCU operating as a system control unit and a plurality of battery voltage monitoring ICs can be realized with the small number of lines while suppressing parts cost and, further, in consideration of a fail-safe without providing a high-function communication interface for each of the battery voltage monitoring ICs and without employing a complicated communication protocol. As for setting of the placement setting pin, setting of a first code indicating that a placement setting pin is disposed in a group of highest potential, a second code indicating that a placement setting pin is disposed in a group of the lowest potential, and a code of a state different only by one bit (code of Hamming distance=1) is inhibited. By detecting that the setting in which the state of the placement setting pin is inhibited, a failure is determined, and an output is interrupted. In such a manner, fail-safe is achieved.

[2] <Switching of Voltage Output/Current Output/HiZ>

In the article 1, the output switching circuit can switch the communication signal pin among driving by a voltage source (12), driving by a current source (11), and setting to high impedance.

The mode determining circuit drives the communication signal pin by the voltage source by the output switching circuit when the state of the placement setting pin group matches the first code. The mode determining circuit drives the communication signal pin by the current source by the output switching circuit when the state of the placement setting pin group matches the second code. The mode determining circuit sets the communication signal pin to high impedance by the output switching circuit when the state of the placement setting pin group is the Hamming distance of 1 from the first code or the second code.

With the configuration, regardless of the type of the circuit coupled to the communication signal pin which is the voltage input type or the current input type, the invention can properly handle. In particular, in the case where the placement setting pin is disposed at the lowest-potential end, it is suitable to drive a step-up level shifter of the current drive type. When it is disposed at the highest-potential end, it is suitable to drive an isolating element (isolator) of the voltage input type. When an error of one bit occurs in an IC address signal on the inside, the error is detected and the communication signal pin is set to high impedance. In such a manner, there becomes no possibility that an external circuit is destroyed, and a fail-safe is achieved.

[3] <Addressing Setting Pin (Pin Addressing)>

In the article 1 or 2, the semiconductor device (battery voltage monitoring IC) further includes an address register (30), the placement setting pin group is an address setting pin (6), and the address register is set on the basis of a state set in the address setting pin.

With the configuration, according to the voltage level (fixed to low/high level, pull-down/pull-up, or the like) applied to the address setting pin (6), the address of the battery voltage monitoring IC can be set from the outside of the IC.

[4] <Mode Setting Pin>

In the article 1 or 2, the semiconductor device (battery voltage monitoring IC) further includes an address register (30) and a communication signal input pin (5). The communication signal pin is a communication signal output pin (4), the placement setting pin group is a mode setting pin (7), and the address register is set on the basis of a state which is set in the mode setting pin and a value input from the communication signal input pin.

With the configuration, the address of the battery voltage monitoring IC can be set according to the voltage level (fixed to low/high, pull-down/pull-up, or the like) applied to the mode setting pin (7) and the value stored in the address register (30) in the IC. For example, by setting one of three ways of placement of the highest-potential end, the lowest-potential end, and an intermediate stage, the remaining detailed addresses can be set by the value disposed in the highest-order end or the lowest-order end. When the pin is disposed at the highest-potential end or the lowest-potential end, the influence of a failure is enormous, so that protection is strengthened. In the case where the pin is disposed between them, the influence of a failure that an error occurs in an address is relatively minor, so that a handling such as strengthening of recovery rather than protection can be performed.

[5] <Auto Addressing>

In the article 4, the semiconductor device (battery voltage monitoring IC) further includes an arithmetic circuit (15), an output selection circuit (16), and a register communication control circuit (17).

The output selection circuit can select either performing an arithmetic operation by the arithmetic circuit on a signal input from the communication signal input pin and outputting the resultant signal to the communication signal output pin or outputting a signal input from the communication signal input pin as it is to the communication signal output pin.

When a register access command designating an IC address is input from the communication signal input pin, an internal register can be accessed by the register communication control circuit on the basis of the register access command.

When an IC address setting command and an IC address value are input from the communication signal input pin, the address register is set on the basis of the IC address value, and the output selection circuit selects the signal subjected to the arithmetic operation by the arithmetic circuit for an IC address value input from the communication signal input pin and outputs it to the communication signal output pin.

With the configuration, even when an IC address is not set yet, an IC address can be set from the outside, and the number of pins for designating an IC address can be suppressed to the minimum.

[6] <Generation of IC Address at Next Stage by Bit Shift>

In article 5, a signal which is input to the communication signal input pin is a bit serial signal, a signal which is output from the communication signal output pin is a bit serial signal, and the arithmetic operation performed by the arithmetic circuit is bit shift.

With the configuration, without converting an address value which is input from the communication signal input pin to a parallel signal, a new address value to be transmitted to the post stage can be calculated. Without delay in the frame period unit, the address value can be transmitted to the post stage.

[7] <Generation of IC Address at Next Stage by Increment>

In article 5, a signal which is input to the communication signal input pin is a bit serial signal, a signal which is output from the communication signal output pin is a bit serial signal, and the arithmetic circuit increments the address value which is input in association with the IC address setting command, and outputs the resultant value from the communication signal output pin.

With the configuration, sequential values are given as IC address values to adjacent semiconductor devices (battery voltage monitoring ICs) (1_1 to 1_M), and the code efficiency can be increased (many addresses can be expressed by smaller number of bits).

[8] <Address Register Diagnosis Mode>

In article 5, when an IC address setting command and an IC address value are input from the communication signal input pin, a value set in the address register on the basis of the IC address value and a value stored in the address register are compared.

With the configuration, in the first IC address setting command, an IC address is automatically set in an address register. In the second and subsequent IC address setting commands, whether the initially set IC address is held or not can be diagnosed.

[9] <Interruption>

In article 1, the semiconductor device further includes an interrupt output pin (52). When it is detected by the mode determining circuit that a state of the placement setting pin group corresponds to a Hamming distance of 1 from the first code or the second code, an interrupt signal is output from the interrupt output pin.

With the configuration, occurrence of a failure can be notified to the battery system control unit promptly and reliably.

[10] <Status Register Batch Reading>

A semiconductor device (battery voltage monitoring IC) (1_1 to 1_M) disposed in each of a plurality of unit cell groups in a plurality of unit cells which construct an assembled battery by being serially coupled in multiple stages between a positive electrode (91) and a negative electrode (92), to which an IC address is given, and the device for monitoring the unit cells belonging to the group is constructed as follows.

The semiconductor device has an address register (30) for holding the IC address given, a communication signal input pin (5), and a communication signal output pin (4).

The semiconductor device has: a chip address determining circuit (22) outputting an IC selection signal (32) on the basis of data of a chip address frame which is input from the communication signal input pin; a register address determining circuit (24) outputting a register selection signal (33) on the basis of data of a register address frame which is input from the communication signal input pin; and a status register which can be designated by the register selection signal.

When selected by the IC selection signal, data of a bit position corresponding to an IC address stored in the address register, of a register read data frame which is input from the communication signal input pin is updated by being replaced with status information of the status register designated by the register selection signal, and the updated register read data frame is transmitted from the communication signal output pin.

With the configuration, status information can be read in a lump from a plurality of semiconductor devices (battery voltage monitoring ICs) (1_1 to 1_M) (simultaneously and in parallel).

[11] <Chip Address Frame>

In article 10, the chip address determining circuit outputs the IC selection signal on the basis of the value of a bit position specified by an IC address stored in the address register in the chip address frame.

With the configuration, one semiconductor device (battery voltage monitoring IC) (1_1 to 1_M) can be designated by one bit in a chip address frame, and zero to M pieces of battery voltage monitoring ICs can be independently designated simultaneously in parallel.

[12] <Address Register Diagnosis Mode>

In article 10 or 11, the semiconductor device further includes a mode setting pin (7), and the status register can store an IC address error. When the chip address frame has a predetermined value and a value which is set in the address register on the basis of the value of the register address frame and a value stored in the address register are different from each other, the IC address error is stored in the status register.

With the configuration, by the first IC address setting command, an IC address is automatically set in an address register. By the second and subsequent IC address setting commands, a diagnosis of whether the initially set IC address is held or not can be made. A diagnosis result is stored as an IC address error into a status register. By a status register batch reading command, diagnosis results can be read in a lump from a plurality of semiconductor devices (battery voltage monitoring ICs) (1_1 to 1_M).

[13] <Interruption of Daisy Chain at the Time of Failure in Battery Voltage Monitoring Device>

A battery voltage monitoring device including a battery system control unit 3 and M pieces of voltage measuring units from a first voltage measuring unit (2_1) to an Mth voltage measuring unit (2_M) disposed for each of M pieces (M is an integer of three or larger) of unit cell groups in a plurality of unit cells which construct an assembled battery by being serially coupled in multiple stages between a positive electrode (91) and a negative electrode (92) is constructed as follows.

For each of M pieces (M is an integer of three or larger) of unit cell groups from a highest potential end (93) close to the positive electrode to a lowest potential end (94) close to the negative electrode, the M pieces of voltage measuring units from a first voltage measuring unit (2_1) to an Mth voltage measuring unit (2_M) are sequentially disposed from the lowest potential end to the highest potential end. The voltage measuring units are identified by first to Mth addresses on the basis of the disposition.

The battery system control unit and the first to M-th voltage measuring units are coupled by a daisy chain (8), and the battery system control unit can access the first to Mth voltage measuring units by communication using the daisy chain.

The first to Mth voltage measuring units have a placement setting pin group (6_1 to 6_M, 7_1 to 7_M) for designating, by a binary code, a unit cell group to which the placement setting pin group is coupled, in the M pieces of unit cell groups.

A state of the placement setting pin group for designating coupling to the unit cell group at the highest potential end is expressed by a first code, and a state of the placement setting pin group for designating coupling to the unit cell group at the lowest potential end is expressed by a second code.

Each of the first to Mth voltage measuring units interrupts the communication using the daisy chain when the state of the placement setting pin group corresponds to a Hamming distance of 1 from the first code or the second code.

With the configuration, communication between an MCU operating as a system control unit and a plurality of battery voltage monitoring ICs can be realized with the small number of lines while suppressing parts cost and, further, in consideration of a fail-safe without providing a high-function communication interface for each of the battery voltage monitoring ICs and without employing a complicated communication protocol. As for setting of the placement setting pin, setting of a first code indicating that a placement setting pin is disposed in a group of highest potential, a second code indicating that a placement setting pin is disposed in a group of the lowest potential, and a code of a state different only by one bit (code of Hamming distance=1) is inhibited. By detecting that the setting in which the state of the placement setting pin is inhibited, a failure is determined, and an output is interrupted. In such a manner, fail-safe is achieved.

[14] <HiZ Control in Ring Network Communication>

In article 13, the first voltage measuring unit and the battery system control unit are coupled via a first communication line (8_1), the Mth voltage measuring unit and the battery system control unit are coupled via a signal potential converting element (9) by an M+1-th communication line (8_M+1). The first and second voltage measuring units are coupled via a second communication line (8_2), and the (M−1) th voltage measuring unit and the Mth voltage measuring unit are coupled by an Mth communication line (8_M).

The first voltage measuring unit drives the second communication line by a current source (11) when the set state of the placement setting pin group is equal to the second code, and sets the second communication line to high impedance when the set state of the placement setting pin group is equal to the Hamming distance of 1 from the second code.

The M-th voltage measuring unit drives the signal potential converting element by a voltage source (12) when the set state of the placement setting pin group is equal to the first code, and sets the coupling to the signal potential converting element to high impedance when the set state of the placement setting pin group is equal to the Hamming distance of 1 from the first code.

With the configuration, in the case where a failure in a placement address is detected in a daisy chain realizing ring network communication, the driving of the communication path can be protected by setting high impedance.

[15] <Address Setting Pin (Pin Addressing)>

In article 13, each of the first to M-th voltage measuring units further includes an address register (30). The placement setting pin group is an address setting pin (6), and the address register is set on the basis of the state which is set in the address setting pin.

With the configuration, according to the voltage level (fixed to low/high level, pull-down/pull-up, or the like) applied to the address setting pin (6), the address of the voltage measuring unit (2_1 to 2_M) can be set from the outside of the IC.

[16] <Mode Setting Pin>

In article 13, each of the first to M-th voltage measuring units further has an address register (30), the placement setting pin group is a mode setting pin (7), and the address register is set on the basis of the state which is set in the mode setting pin and a value designated by communication using the daisy chain.

With the configuration, the address of the voltage measuring unit can be set according to the voltage level (fixed to low/high, pull-down/pull-up, or the like) applied to the mode setting pin (7) and the value stored in the address register (30) in the IC. For example, by setting one of three ways of placement of the highest-potential end, the lowest-potential end, and an intermediate stage by the mode setting end (7), the remaining detailed addresses can be set by the value stored in the address register (30). When the pin is disposed at the highest-potential end or the lowest-potential end, the influence of a failure is enormous, so that protection is strengthened. In the case where the pin is disposed between them, the influence of a failure that an error occurs in an address is relatively minor, so that a handling such as strengthening of recovery rather than protection can be performed.

[17] <Auto Addressing>

In article 16, the communication using the daisy chain is serial communication, and the battery system control unit can issue a command made of a plurality of bits.

The command includes a chip address frame including M bits, which can independently designate any of the first to M-th voltage measuring units as an object to be accessed.

An address setting command in the command includes a chip address frame indicating that any of the first to M-th voltage measuring units is not an object to be accessed and a data frame indicative of an address value to be set in the first voltage measuring unit.

The first voltage measuring unit receives the address setting command and stores a value based on the value of the data frame into the address register. Further, the first voltage measuring unit replaces the received address setting command with a new address setting command including the received address frame and a new data frame obtained by performing a predetermined arithmetic operation on the value of the data frame, and transmits the new address setting command to the second voltage measuring unit via the second communication line.

Each of the second to the (M-1)th voltage measuring units replaces the received address setting command with a new address setting command including the received address frame and a new data frame by a value obtained by performing the arithmetic operation on the value of the received data frame, and transmits the new address setting command to a voltage measuring unit at the next stage.

With the configuration, even when an IC address is not set yet, an IC address can be set from the outside, and the number of pins for designating an IC address can be suppressed to the minimum.

[18] <Generation of IC Address at Next Stage by Bit Shift>

In article 17, the arithmetic operation is a bit shift of a value of a received data frame.

With the configuration, without converting an address value which is input from the communication signal input pin to a parallel signal, a new address value to be transmitted to the post stage can be calculated. Without delay in the frame period unit, the address value can be transmitted to the post stage.

[19] <Generation of IC Address at Next Stage by Increment>

In article 17, the arithmetic operation is increment of the value of a received data frame.

With the configuration, sequential values are given as IC address values to adjacent semiconductor devices (battery voltage monitoring ICs) (1_1 to 1_M), and the code efficiency can be increased (many addresses can be expressed by smaller number of bits).

[20] <Address Register Diagnosis Mode>

In article 17, on receipt of the address setting command, each of the first to (M-1)th voltage measuring units compares a value which is set in the address register on the basis of the value of the data frame with the value stored in the address register.

With the configuration, in the first IC address setting command, an IC address is automatically set in an address register. In the second and subsequent IC address setting commands, whether the initially set IC address is held or not can be diagnosed.

[21] <Detection of Failure in Placement Setting Pin and Shift to Sleep Mode>

A semiconductor device (battery voltage monitoring IC) (1_1 to 1_M) disposed in each of M pieces (M is an integer of three or larger) of unit cell groups in a plurality of unit cells which construct an assembled battery by being serially coupled in multiple stages between a positive electrode (91) and a negative electrode (92), the M pieces of unit cell groups existing from a first tap (93) close to the positive electrode and a second tap (94) close to the negative electrode, and the device for monitoring the unit cells belonging to the group is constructed as follows.

The semiconductor device has a normal operation mode and a sleep mode, and includes a mode switching circuit for switching from the normal operation mode to the sleep mode, a placement setting pin group (6, 7) for designating, by a binary code, a unit cell group to which the placement setting pin group is coupled, in the M pieces of unit cell groups, and a mode determining circuit (20) for controlling the mode switching circuit on the basis of a state of the placement setting pin group.

A state of the placement setting pin group for designating coupling to the first tap is expressed by a first code, and a state of the placement setting pin group for designating coupling to the second tap is expressed by a second code.

The mode determining circuit makes the semiconductor device shift from the normal operation mode to the sleep mode by the mode switching circuit when the state of the placement setting pin group corresponds to a Hamming distance of 1 from the first code or the second code.

With the configuration, communication between an MCU operating as a system control unit and a plurality of battery voltage monitoring ICs can be realized with the small number of lines while suppressing parts cost and, further, in consideration of a fail-safe without providing a high-function communication interface for each of the battery voltage monitoring ICs and without employing a complicated communication protocol. As for setting of the placement setting pin, setting of a first code indicating that a placement setting pin is disposed in a group of highest potential, a second code indicating that a placement setting pin is disposed in a group of the lowest potential, and a code of a state different only by one bit (code of Hamming distance=1) is inhibited. By detecting that the setting in which the state of the placement setting pin is inhibited, a failure is determined, and an output is interrupted. In such a manner, fail-safe is achieved.

[22] <Interruption in Address Register Diagnosis Mode>

In article 8, the semiconductor device further includes an interrupt output pin (52). When the comparison result of an IC address value stored in the address register and an IC address value newly set is mismatch, an interrupt signal is output from the interrupt output pin.

With the configuration, when the diagnosis result that the initially set IC address is not properly held is detected, occurrence of the failure can be notified to the battery system control unit promptly and reliably.

[23] <Interrupt Communication of Daisy Chain Configuration>

In article 9 or 22, the semiconductor device further includes an interrupt input pin (51). In the case where a signal input from the interrupt input pin is an interrupt signal or in the case where an interrupt signal is output from the semiconductor device itself, an interrupt signal is output from the interrupt output pin.

With the configuration, an interrupt signal transmission path can be configured by a daisy chain, and the number of lines by an interrupt signal can be suppressed.

[24] <Status Register Batch Reading>

A battery voltage monitoring device including a battery system control unit and M pieces of voltage measuring units from a first voltage measuring unit (2_1) to an Mth voltage measuring unit (2_M) disposed for each of M pieces (M is an integer of three or larger) of unit cell groups in a plurality of unit cells which construct an assembled battery by being serially coupled in multiple stages between a positive electrode (91) and a negative electrode (92) is constructed as follows.

For each of M pieces (M is an integer of three or larger) of unit cell groups from a highest potential end (93) close to the positive electrode to a lowest potential end (94) close to the negative electrode, the M pieces of voltage measuring units from a first voltage measuring unit (2_1) to an Mth voltage measuring unit (2_M) are sequentially disposed from the lowest potential end to the highest potential end. The voltage measuring units are identified by first to Mth addresses on the basis of the disposition.

The battery system control unit and the first to M-th voltage measuring units are coupled by a daisy chain (8), and the battery system control unit can access the first to Mth voltage measuring units by communication using the daisy chain.

The first to Mth voltage measuring units hold placement addresses which are respectively set.

The battery system control unit transmits a chip address frame, a register address frame, and a register read data frame which does not include valid data from the first to Mth voltage measuring units by communication using the daisy chain, and receives a register read data frame including read data.

Each of the first to Mth voltage measuring units transmits the chip address frame and the register address frame received as they are. When the placement addresses which are set respectively match a placement address designated by the chip address frame, each of the first to Mth voltage measuring units updates the data of the bit position corresponding to the placement address, in the register read data frame by replacing the data with status information of a status register (25) designated by the register address frame, and transmits the updated register read data frame to the daisy chain.

With the configuration, status information can be read in a lump (simultaneously and in parallel) from the plurality of voltage measuring units (2_1 to 2_M).

[25] <Chip Address Frame>

In article 24, the chip address frame includes address designation bits of M bits which can independently designate the first to Mth voltage measuring units.

With the configuration, in the chip address frame, one voltage measuring unit (2_1 to 2_M) can be designated by one bit, and zero to M pieces of voltage measuring units can be independently designated simultaneously in parallel.

[26] <Address Register Diagnosis Mode>

In article 24 or 25, each of the first to Mth voltage measuring units further includes a mode setting pin (7) and an address register (31) holding the placement address, and the status register can store a chip address error. When the chip address frame has a predetermined value, an IC address is set in the address register on the basis of the value of the register address frame. The IC address set in the address register and an IC address stored in the address register are compared and, when the result is mismatch, the chip address error is stored in the status register.

With the configuration, by the first IC address setting command, an IC address is automatically set in an address register. By the second and subsequent IC address setting commands, a diagnosis of whether the initially set IC address is held or not can be made. A diagnosis result is stored as an IC address error into a status register. By a status register batch reading command, diagnosis results can be read in a lump from a plurality of semiconductor devices (battery voltage monitoring ICs) (1_1 to 1_M).

[27] <Interruption>

In article 13, each of the first to Mth voltage measuring units further includes an interrupt output pin (52). When it is detected that a state of the placement setting pin group corresponds to a Hamming distance of 1 from the first code or the second code, an interrupt signal is output from the interrupt output pin.

With the configuration, occurrence of a failure can be notified to the battery system control unit promptly and reliably.

[28] <Interruption in Address Register Diagnosis Mode>

In article 20, each of the first to Mth voltage measuring units further includes an interrupt output pin (52). When an IC address set in the address register and an IC address stored in the address register are compared and do not match as a result, an interrupt signal is output from the interrupt output pin.

With the configuration, in the case where a diagnosis result that the initially set IC address is not properly held is detected, occurrence of a failure can be notified to the battery system control unit promptly and reliably.

[29] <Interrupt Communication in Daisy-Chain Configuration>

In article 27 or 28, each of the first to Mth voltage measuring units further includes an interrupt input pin (51). In the case where a signal input from the interrupt input pin is an interrupt signal, or in the case where the unit generates an interruption by itself, an interrupt signal is output from the interrupt output pin.

With the configuration, an interrupt signal transmission path can be configured by a daisy chain, and the number of lines for the interrupt signal can be suppressed.

2. Further Detailed Description of the Embodiments

The embodiments will be described more specifically. In all of the drawings for explaining modes for carrying out the invention, the same reference numerals are assigned to elements having the same function, and repetitive description will not be given.

First Embodiment <HiZ Control>

FIG. 1 is a block diagram illustrating a configuration example of a battery voltage monitoring device in which a battery voltage monitoring IC according to a first embodiment, a battery system control unit, and a plurality of battery voltage monitoring ICs are coupled by a daisy chain performing ring network communication.

An assembled battery is constructed by coupling a plurality of unit cells in series in multiple stages. The assembly battery is divided into M pieces (M denotes an integer of three or larger) of unit cell groups each made of some unit cells, and M pieces of voltage measuring modules 2 on which battery voltage monitoring ICs 1 are mounted are disposed for each unit cell group. Since the M pieces of unit cell groups are originally coupled in series, the M pieces of voltage measuring modules 2 disposed have potentials which vary step by step between a lowest potential pin 94 and a highest potential pin 93. Normally, the lowest potential pin 94 is a negative electrode 92 of the assembled battery, and the highest potential pin 93 is a positive electrode 91.

It is also possible to divide an assembled battery to N×M pieces of unit cell groups, dispose a set of battery voltage monitoring devices for the M pieces of unit cell groups, and configure a general battery voltage monitoring device by the N pieces of battery voltage monitoring devices. By disposing a plurality of battery voltage monitoring devices, the invention can be applied also to an assembled battery of higher voltage and a large-scale assembled battery in which a plurality of assembled batteries are coupled in parallel.

To the M pieces of voltage measuring modules 2 from a first voltage measuring module 2_1 to an M-th voltage measuring module 2_M, placement addresses from the first address to the M-th address are designated on the basis of positions where the modules are disposed. The voltage measuring modules 2 are identified by the placement addresses. The position where the voltage measuring module 2 is disposed is a tap position in the unit cells coupled in series and corresponds to a potential in the assembled battery. The first voltage measuring module 2_1 to which the first address is given is coupled to the lowest potential pin 94, the second voltage measuring module 2-2 and subsequent modules are sequentially coupled to taps of higher potentials, and the M-th voltage measuring module 2_M to which the M-th address is given is coupled to the highest potential pin 93.

A battery system control unit 3 and the M pieces of voltage measuring modules 2 from the first voltage measuring module 2_1 to the M-th voltage measuring module 2_M are coupled by a daisy chain 8. In FIG. 1, the daisy chain 8 performing ring network communication is illustrated as a coupling example. The first voltage measuring module 2_1 and the battery system control unit 3 are coupled by a first communication line 8_1, the M-th voltage measuring module 2_M and the battery system control unit 3 are coupled by an M+1th communication line 8_M+1 via a signal potential converting element 9, the first voltage measuring module 2_1 and the second voltage measuring module 2_2 are coupled by a second communication line 8_2, and the M−1th voltage measuring module 2_M−1 and the M-th voltage measuring module 2_M are coupled by an M-th communication line 8_M. The signal potential converting element 9 is an isolating element (isolator) transmitting communication data while performing direct-current isolation and is, for example, a photo coupler, an induction coupled isolating element, a capacitance-coupled isolating element, or the like. The voltage measuring modules 2 from the first voltage measuring module 2_1 to the M-th voltage measuring module 2_M hold placement addresses which are respectively set. The battery system control unit 3 can access from the first voltage measuring module 2_1 to the M-th voltage measuring module 2_M by communication using the daisy chain 8. When the battery voltage monitoring IC 1 is mounted on the voltage measuring module 2, the placement address held in the monitoring IC 1 is an address designated to the IC and called an IC address.

The M pieces of voltage measuring modules 2 from the first voltage measuring module 2_1 to the M-th voltage measuring module 2_M have placement setting pin groups (6_1 to 6_M and 7_1 to 7_M) each designating a unit cell group to which the voltage measuring module 2 is coupled in M unit cell groups by a binary code. To the placement setting pin groups (6_1 to 6_M and 7_1 to 7_M), a first code is input at the time of designating coupling to the unit cell group of the highest potential pin, and a second code is input at the time of designating coupling to the unit cell group of the lowest potential pin. It is sufficient to fix the placement setting pin to the high level or low level in the voltage measuring module 2 and perform pull-up or pull-down, or input a digital signal by another method. Each of the M pieces of voltage measuring modules 2 from the first voltage measuring module 2_1 to the M-th voltage measuring module 2_M interrupts communication via the daisy chain 8 when the state of the input placement setting pin group (6_1 to 6_M, 7_1 to 7_M) is the Hamming distance of 1 from the first or second code. For example, an output to the communication line (8_1 to 8_M+1) in the daisy chain 8 is set to high impedance.

A circuit on the other party coupled in the daisy chain 8 of each of the M pieces of voltage measuring modules 2 from the first voltage measuring module 2_1 to the M-th voltage measuring module 2_M varies depending on a unit cell group to be coupled in the M pieces of unit cell groups, so that the characteristics of a circuit for driving the communication line (8_1 to 8_M+1) of the daisy chain 8 have to be adapted. The first voltage measuring module 2_1 drives the second voltage measuring module 2_2 at a higher potential level, which is usually at the same potential level and is input via the second communication line 8_2. The M-th voltage measuring module drives the signal potential converting element 9 by an input via the M−1 voltage measuring module 2_M−1 to the Mth communication line 8_M at a potential level lower by one level. Since the presence/absence of a level shifter and a circuit method vary depending on the potential levels, the characteristics of a circuit for driving the communication lines (8_1 to 8_M+1) of the daisy chain have to be adapted in accordance with them.

The placement addresses from the first to Mth addresses are set in the placement setting pin group (6_1 to 6_M, 7_1 to 7_M). On the basis of them, a unit cell group to be coupled in the M pieces of unit cell groups is determined. In accordance with the group, the characteristics of the circuit for driving the communication lines (8_1 to 8_M+1) of the daisy chain 8 can be adapted. When the placement address is correct, the communication circuit configuring the daisy chain functions properly. However, in the case where the state of the placement setting pin groups (6_1 to 6_M, 7_1 to 7_M) becomes an incorrect code due to a failure or the like, the communication circuit does not function properly. Consequently, the idea of a fail-safe is employed.

In the embodiment, a part in which the influence of the error of the address due to a failure or the like is serious is protected in an emphasized manner. In a battery voltage monitoring device in which communication paths of the daisy chain are formed, a failure in the highest potential end and the lowest potential end is more serious. Since the battery voltage measuring module 2 coupled to an intermediate potential is coupled to only an adjacent battery voltage measuring module 2, the potential difference is not large. However, the potential difference between each of the battery voltage measuring modules 2 disposed at the highest potential end and the lowest potential end and a coupling destination is large, and there is the possibility that the potential difference becomes the potential difference between the highest potential end and the lowest potential end in some cases.

In the embodiment, when the state of the placement setting pin group (6_1 to 6_M, 7_1 to 7_M) is that the Hamming distance to the first code or the second code is 1, the communication using the daisy chain 8 is interrupted. When an error of one bit occurs in the first code which is set in the battery voltage measuring module 2_M originally disposed in the highest potential end 93 or when an error of one bit occurs in the second code which is set in the battery voltage measuring module 2_1 originally disposed in the lowest potential end 94, the interruption is performed so as not to drive the communication path. On the other hand, even when an error of one bit occurs in a code set in the battery voltage measuring module 2 disposed in a tap position of an intermediate potential, switching exerting a serious influence does not occur in the circuit driving the daisy chain.

With the configuration, communication between the battery system control unit 3 and the plurality of battery voltage monitoring modules 2 can be realized with the small number of lines while suppressing parts cost and, further, in consideration of a fail-safe without providing a high-function communication interface for each of the battery voltage measuring modules 2 and without employing a complicated communication protocol. In the case where the state of the placement setting pin group (6_1 to 6_M, 7_1 to 7_M) becomes an incorrect code due to a failure or the like, not by generating an error but by disconnecting the group from the communication path, fail-safe is achieved.

The case where the battery voltage monitoring ICs 1_1 to 1_M are mounted in the M pieces of voltage measuring modules 2 from the first voltage measuring module 2_1 to the Mth voltage measuring module 2_M and the placement setting pin groups (6_1 to 6_M, 7_1 to 7_M) are pins of the ICs will be described more specifically.

Since the communication signal input pin 5_1 of the first voltage measuring module 2_1 at the lowest potential end is driven by the MCU operating as the battery system control unit 3, generally, voltage is input. Since the communication signal output pin 4_1 is coupled to the communication signal input pin 5_2 of the second voltage measuring module 2_2 on the potential side higher by one level by the level shifter, current output is preferred. Since both input and output of each of the voltage measuring modules 2 in the second and subsequent stages are coupled to the level shifters, voltage input and current output are preferable. The communication signal input pin 5_M of the Mth voltage measuring module 2_M at the highest potential end is coupled to the output of the level shifter, so that voltage is input. The communication signal output pin 4_M is optimized in accordance with a loopback communication circuit method. For example, in the case of circulating a signal to the MCU 3 via the isolating element (isolator) 9 such as a photo coupler, the isolating element 9 is driven. Consequently, in many cases, voltage output is preferable. Although there are various circuit methods for the level shifter, a circuit for converting a signal which is current output on the low potential side to a voltage by a resistor on the high potential side is assumed. A step-down level shifter can be realized by a similar circuit.

When the set state of the placement setting end group (6_1, 7_1) is equal to the first code, the first voltage measuring module 2_1 drives the second communication line 8_2 by the current source. When the set state of the placement setting end group (6_1, 7_1) is the Hamming distance of 1 from the first code, the first voltage measuring module 2_1 sets the second communication line 8_2 to high impedance.

When the set state of the placement setting end group (6_1, 7_1) is equal to the second code, the Mth voltage measuring module 2_M drives the signal potential converting element 9 by the voltage source. When the set state of the placement setting end group (6_1, 7_1) is the Hamming distance of 1 from the second code, the Mth voltage measuring module 2_M sets the signal potential converting element 9 to high impedance.

In such a manner, in the case where a failure in a placement address is detected in the daisy chain realizing ring network communication, the drive of the communication path can be protected by setting high impedance.

Figure 3:
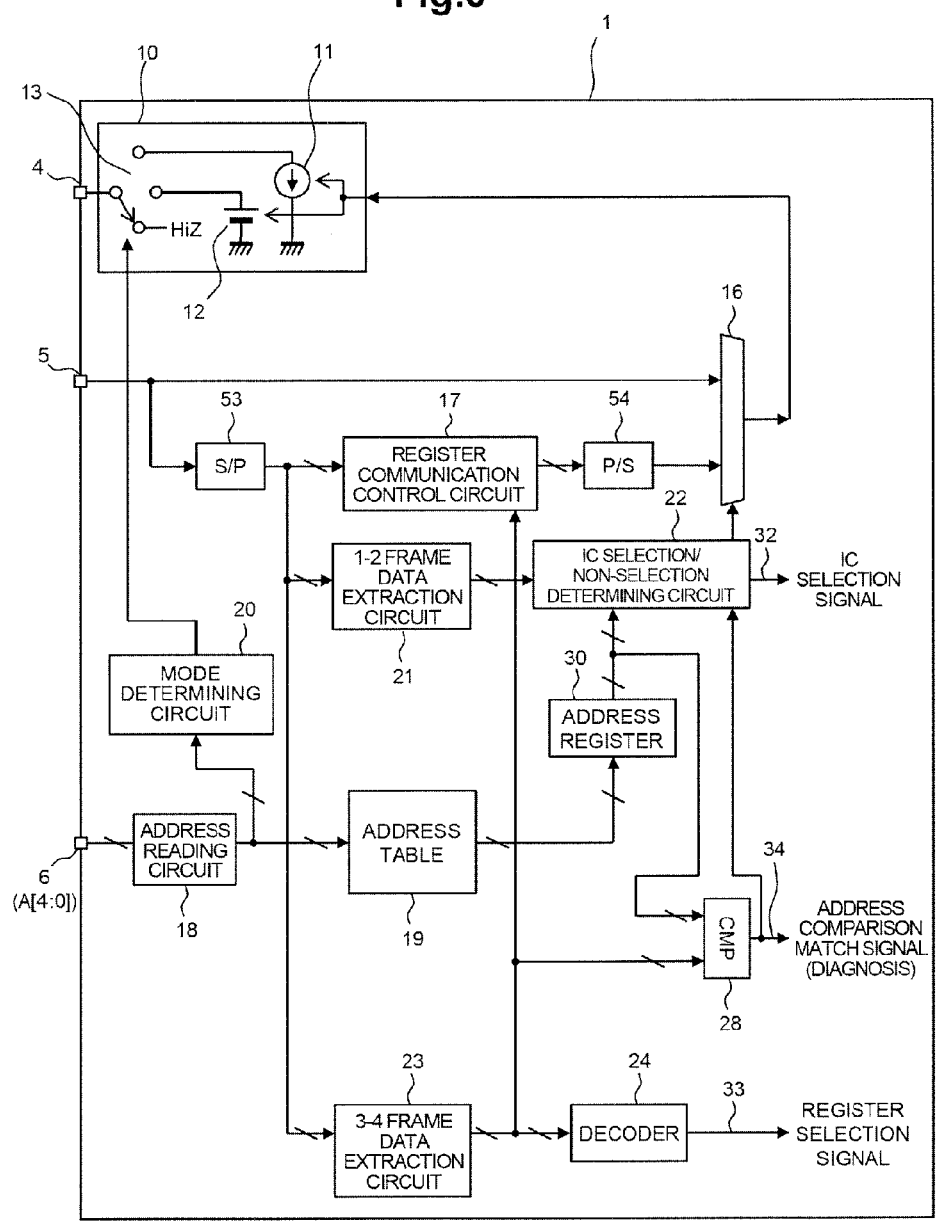
FIG. 3 is a block diagram illustrating a more detailed configuration example of the battery voltage monitoring IC (pin addressing) according to the first embodiment.

The more detailed configuration of the battery voltage monitoring IC 1 which can be mounted on the M pieces of voltage measuring modules 2 from the first voltage measuring module 2_1 to the Mth voltage measuring module 2_M will be described. FIG. 3 is a block diagram illustrating a more detailed configuration example of the battery voltage monitoring IC (pin addressing) according to the first embodiment.

The battery voltage monitoring IC 1 has a communication signal pin 4, an address setting pin 6 as the placement setting pin, an output switching circuit 10 capable of switching between output and interruption of a signal from the communication signal pin, and a mode determining circuit 20 controlling the output switching circuit 10 on the basis of the state of the address setting pin 6. When the state of the address setting pin 6 is the Hamming distance of 1 from the first or second code, the mode determining circuit 20 interrupts an output from the communication signal pin 4 by the output switching circuit 10.

The output switching circuit 10 can switch the communication signal pin 4 among driving by a voltage source 12, driving by a current source 11, and setting to high impedance. The mode determining circuit 20 controls the communication signal pin 4 as follows.

When the state of the address setting pin 6 matches the first code, the communication signal pin 4 is driven by the voltage source 12 by the output switching circuit 10. When the state of the address setting pin 6 matches the second code, the communication signal pin 4 is driven by the current source 11 by the output switching circuit 10. When the state of the address setting pin 6 is the Hamming distance of 1 from the first or second code, the communication signal pin 4 is set to high impedance by the output switching circuit 10.

With the configuration, regardless of the type of the circuit coupled to the communication signal pin which is the voltage input type or the current input type, the invention can properly handle. In particular, in the case where the placement setting pin is disposed at the lowest-potential end, it is suitable to drive a step-up level shifter of the current drive type. When it is disposed at the highest-potential end, it is suitable to drive an isolating element (isolator) of the voltage input type. When an error of one bit occurs in the state of the address setting pin 6, the error is detected and the communication signal pin is set to high impedance. In such a manner, there becomes no possibility that an external circuit is destroyed, and a fail-safe is achieved.

The other circuit elements illustrated in FIG. 3 will be described later.

Figure 5:
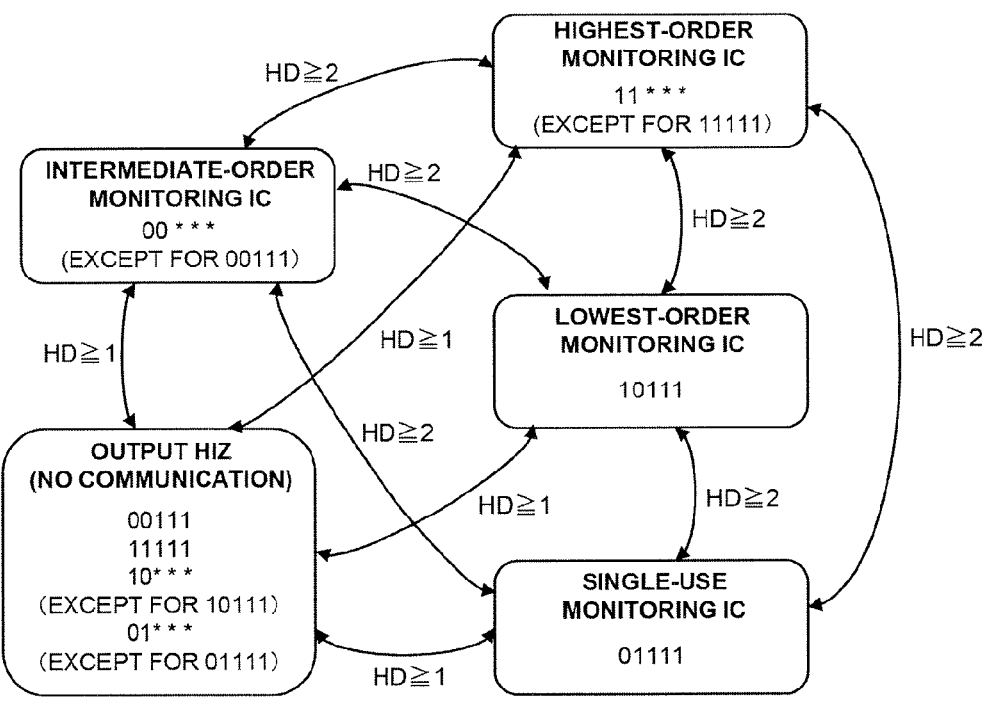
FIG. 5 is an explanatory diagram expressing Hamming distances of placement addresses of battery voltage monitoring ICs (placement addresses of battery voltage monitoring modules) which are set in address setting pins in the battery voltage monitoring device according to the first embodiment.

FIG. 5 is an explanatory diagram expressing Hamming distances between placement addresses of battery voltage monitoring ICs (placement addresses of battery voltage monitoring modules) set in the address setting pins 6 in the battery voltage monitoring device according to the first embodiment. This numerical example is an example of setting a placement address in the battery voltage monitoring system, which can be coupled to a unit cell group in which eight unit cells are coupled in series. To the monitoring IC1 at the highest level disposed at the highest potential end, b'11* except for b'11111 is given as a placement address. "b'" expresses that the address is binary, and "b'11111" expresses a numerical value in which all of bits in binary numbers in five digits are 1. To the monitoring IC 1 at the lowest order, b'10111 is given. Since b'11111 is excluded from addresses which can be set in the monitoring IC at the highest order, the Hamming distance to the placement address b'10111 of the monitoring IC at the lowest order is always 2 or larger. It is sufficient to set b'00* except for b'00111 as the placement address of an intermediate monitoring IC between the highest order and the lowest order. The Hamming distance between the highest-order monitoring IC or the lowest-order monitoring IC and the placement address of an intermediate monitoring IC is two or larger. Further, in the case of singularly using a monitoring IC, it is sufficient to give the placement address b'01111. By setting the placement address of a singular-use monitoring IC to b'01111, all of the highest-order, lowest-order, and intermediate monitoring ICs can have the Hamming distance of two or larger. When the state of the address setting pin 6 is a placement address which is not assigned as the addresses for the highest-order, lowest-order, and intermediate monitoring ICs and the singular-use monitoring IC, an output is set to high impedance to interrupt a communication path (no communication). The placement address having the Hamming distance of 1 from the placement addresses of the highest-order, lowest-order, and intermediate monitoring ICs and the singular-use monitoring IC is a placement address in which an output has to be always controlled to HiZ. A characteristic point is that a plurality of intermediate monitoring ICs may exist and placement addresses to be set for them allow the Hamming distance=1 for one another. Even when an error occurs in a placement address set for an intermediate monitoring IC, the influence of the error is relatively minor, so that redundancy for error detection is not provided. Consequently, at the time of a failure in a circuit board on which monitoring ICs are mounted and at the time of a failure in a monitoring IC, without changing or considering an external pin (for address setting), the intermediate monitoring IC can be easily and safely exchanged. When a failure occurs in an address of the monitoring ICs of any of highest-order, lowest-order, the influence is serious. Therefore, by setting the placement address apart from the other placement addresses by the Hamming code=2 or larger, an error detecting function is provided, and protection is strengthened. As compared with the case of providing redundancy uniformly, the number of bits for expressing a placement address can be suppressed to be smaller. Although FIG. 5 illustrates an example that eight monitoring ICs 1 can be identified, the invention can be expanded to a method of assigning placement addresses by which monitoring ICs 1 of the number equal to or less than eight, or equal to or larger than eight can be identified. To double the number of monitoring ICs to be identified, it is sufficient to increase the number of bits of a placement address by one bit, that is, to increase the number of pins of the address setting pins 6 by one. On the other hand, to uniformly provide redundancy to all of monitoring ICs, to double the number of monitoring ICs to be identified, the number of pins of the address setting pins 6 has to be increased by two. In this point as well, the address assignment method of the embodiment can suppress the number of bits for expressing a placement address and can suppress the number of pins of the address setting pins 6 to be provided for the monitoring ICs.

The battery voltage monitoring IC 1 can further set an address register 30 on the basis of the state set in the address setting pin 6. A value input from the address setting pin 6 is fetched by an address reading circuit 18, for example, immediately after power on, and converted to an IC address value via an address table 19, and the value is stored in the address register 30.

In such a manner, the address register 30 can be set from the outside of the IC in accordance with a voltage level to be applied to the address setting pin 6. By fixing the address setting pin 6 to the low or high level or by performing pull-down or pull-up, a desired address can be set.

FIG. 6 is an explanatory diagram expressing an example of address tables of the battery voltage monitoring IC (pin addressing) according to the first embodiment. The relation between the state of the address setting pin 6 and a value stored in the address register is written. (a) illustrates a general setting method. (b) illustrates an example of eight stacks (the case where eight voltage monitoring modules coupled to eight unit cell groups are provided, that is, the case corresponding to M=8). The chip address frame is a display example in a communication frame designating a chip address to be accessed in a daisy chain communication. The operation of the daisy chain communication and the format of a communication frame will be described later.

On the basis of the state set in the address setting pin 6, an address is stored in an address register. In the case of eight stacks, the address at the highest order can be set to b'11000, the address at the lowest order can be set to b'11111, and an intermediate address can be set to b'11***.

The operations of the daisy chain communication and the formats of communication frames will be described. The battery voltage monitoring IC 1 has not-illustrated various registers. The registers include a control register for controlling the battery voltage monitoring IC 1, a data register for holding data, and a status register for holding the status of the battery voltage monitoring IC 1 and the status of an electric battery to be measured. Register addresses are assigned to those registers. By designating a chip address and a register address, a desired register can be accessed from the battery system control unit 3.

Figure 15:
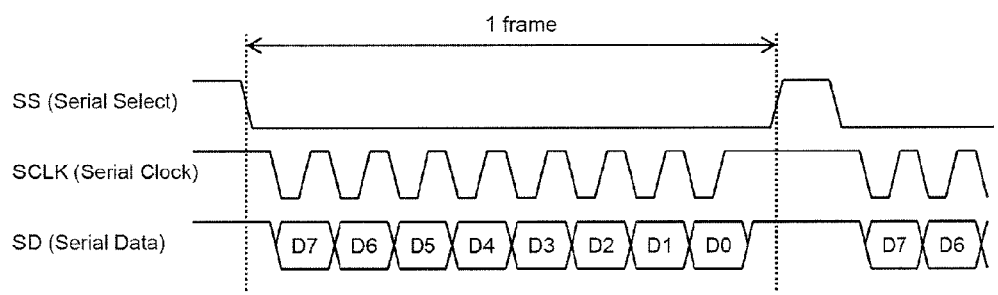
FIG. 15 is a timing chart of one frame, illustrating an example operations of a daisy chain communication.
Figure 16:
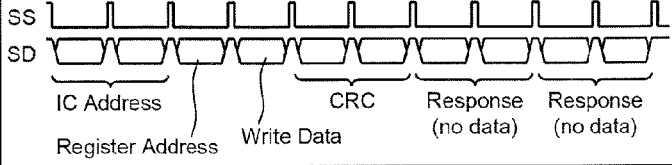
FIG. 16 illustrates an example of frame formats of respective operations in various communication modes.

FIG. 15 is a timing chart of one frame, illustrating an example operations of a daisy chain communication, and FIG. 16 illustrates an example of frame formats of respective operations in various communication modes.

The daisy chain communication is realized by a serial select signal SS, a serial clock signal SCLK, and a serial data signal SD. Each of the signals can be constructed by one bit, and can be constructed by at least total three signal lines. The differentiation can be carried out by using signal lines of the number which is twice as many as the three signal lines, or data may be partially parallelized. FIG. 15 illustrates an example of configuring one frame by eight bits. The number of bits can be arbitrarily determined.

In the normal mode, there are two commands of register writing from the host to each IC and register reading of each IC from the host. The host is a main body which issues a command, and the IC is an access destination having a register designated by the command. In the embodiment, the battery system control unit 3 is a host, and the battery voltage monitoring IC (1_1 to 1_M) is an IC.

In register writing, first and second frames are chip address frames, and IC addresses are designated. In the third frame, a register address is designated and a write command is also designated. In the fourth frame, write data is designated. In the fifth and sixth frames, a CRC (Cyclic Redundancy Check) code for error detection to the commands in the first to fourth frames is transmitted. In the seventh to tenth frames, a response signal can be transmitted (returned) from each of ICs accessed. The register writing is generally an operation which completes in a single direction from a host to an IC, and return of a response signal is unnecessary. The chip address frame is configured so as to include the same number of bits as the number of ICs coupled. By using two frames each made of eight bits, up to 16 ICs can be designated. By making one IC correspond to one bit, up to 16 ICs can be designated independently. The same value can be written concurrently in parallel to the maximum 16 ICs and, on the other hand, ICs can be designated one by one sequentially, and independent values can be written in the ICs.

Also in the register writing, the first and second frames are chip address frames to designate IC addresses. In the third frame, the register address is designated, and a read command is also designated. In the fourth frame, the size of data to be read is designated. In the fifth and sixth frames, a CRC code for error detection to the commands in the first to fourth frames is transmitted. In the seventh and subsequent frames, read data of the number of frames corresponding to the data size designated in the fourth frame, to which the CRC code for the read data is added, is transmitted (returned) from an accessed IC.

Although the case where the number of chip address frames is two, the number of command frame for designating a register address and read/write is one, and each of read data and a CRC code is made of two bytes is illustrated in FIG. 16, the format including the lengths (the number of frames) can be arbitrarily set.

An addressing mode and a test mode will be described later.

The configuration of the battery voltage monitoring IC 1 to respond to a command in the normal mode in the daisy chain communication will be described with reference to FIG. 3.

All of frames in the daisy chain communication are supplied from the communication signal input pin 5 and are transmitted as they are. Alternately, a response frame or the like is added or data of a part of received frames is rewritten, and the resultant is transmitted to the battery voltage monitoring IC 1 at the post stage, so that a signal is output from the communication signal output pin 4. Circuits related to the serial select signal SS and the serial clock signal SCLK are not illustrated in FIG. 3, and FIG. 3 illustrates on assumption that the serial data SD is input from the communication signal input pin 5.

The serial data signal SD input from the communication signal input pin 5 is serial-parallel converted, and the resultant signal is input parallel to a register communication control circuit 17, a chip address frame extraction circuit 21, and a register address frame extraction circuit 23. When it is detected by the chip address frame extraction circuit 21 that the input serial data signal SD is first and second frames in the frame format, the signal is transferred to an IC selection/non-selection determination circuit 22 and compared with an IC address stored in the address register 30. When they match, an IC selection signal 32 is output. When the register address frame extraction circuit 23 detects that the input serial data signal SD is third and fourth frames in the frame format, the signal is transferred to a register address determination circuit 24 constructed by a decoder, and a register selection signal 33 is output. The register address determination circuit 24 determines whether the signal is a write command or a read command. When it is determined by the IC selection signal 32 that the IC of itself is an object to be accessed, a register (not illustrated in FIG. 3) designated by the register selection signal 33 is accessed according to the determined read/write command, and a response frame is constructed by the register communication control circuit 17 on the basis of the access result. The register communication control circuit 17 also calculates a CRC of the response frame and adds a CRC frame. The constructed response frame is output from the communication signal output pin 4 via a parallel-serial converter 54, an output selection circuit 16, and an output switching circuit 10.

With the configuration, by using the daisy chain communication, the register in the battery voltage monitoring IC 1 can be accessed. The block diagram of FIG. 3 is made in accordance with the frame configuration illustrated in FIG. 16 and is just an example. The frame format such as the number of bits of one frame and whether the chip address is constructed by a frame may be properly determined in accordance with the number of ICs as communication targets, the number of registers per IC, and the like.

Second Embodiment <Loopback Communication>

Figure 2:
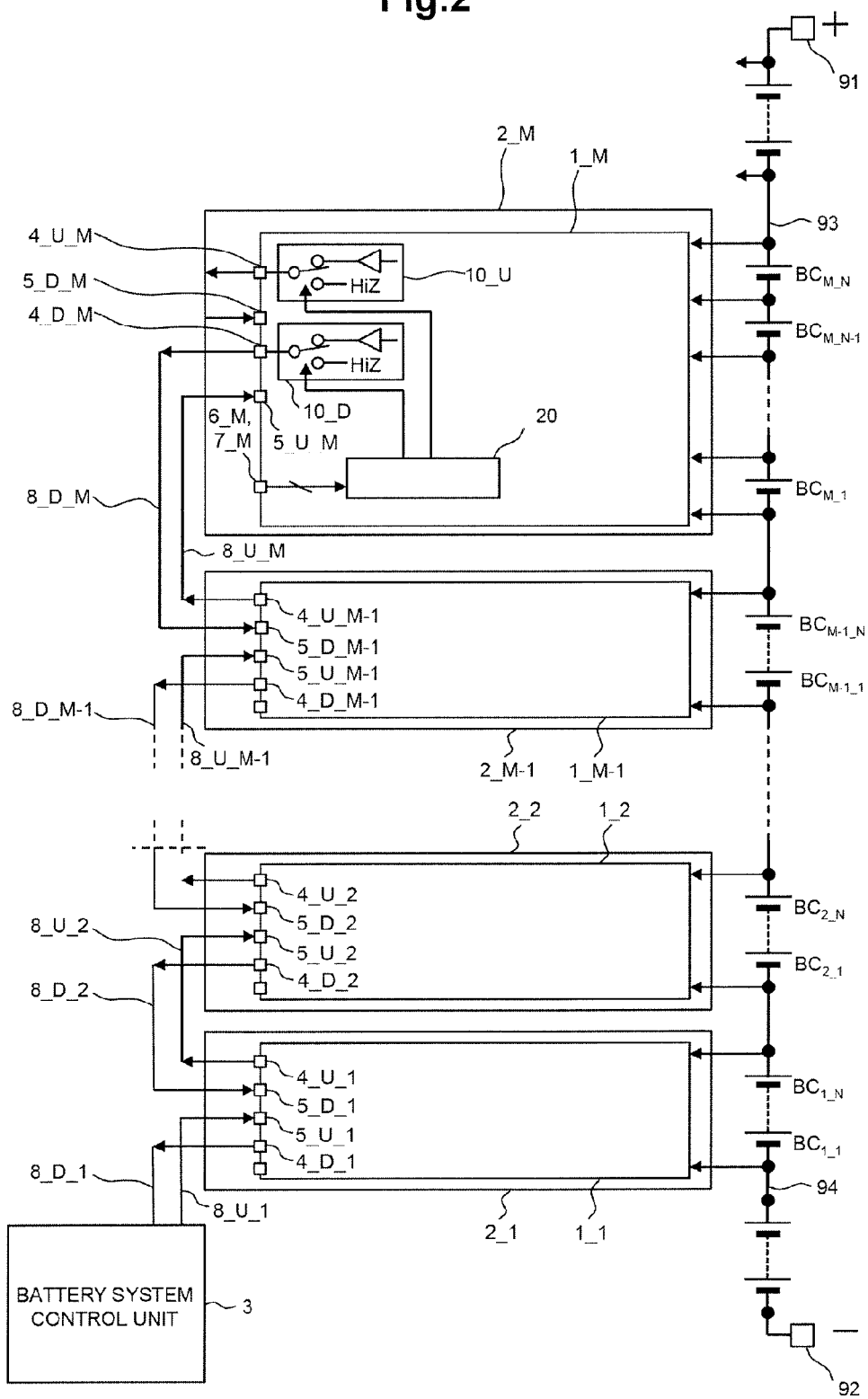
FIG. 2 is a block diagram illustrating a configuration example of a battery voltage monitoring device IC according to a second embodiment and a battery voltage monitoring device in which a battery system control unit and a plurality of battery voltage monitoring ICs are coupled by a daisy chain performing loopback communication.

FIG. 2 is a block diagram illustrating a configuration example of a battery voltage monitoring device IC according to a second embodiment and a battery voltage monitoring device in which a battery system control unit and a plurality of battery voltage monitoring ICs are coupled by a daisy chain performing loopback communication.

Although the daisy chain 8 performing a ring network communication is illustrated as a coupling example in FIG. 1 in the first embodiment, the daisy chain 8 performing the loopback communication is illustrated in the second embodiment. The second embodiment is similar to the first embodiment with respect to the point that the battery system control unit 3 and the M pieces of voltage measuring modules 2 from the first voltage measuring module 2_1 to the M-th voltage measuring module 2_M are coupled by the daisy chain 8 but is different with respect to the point that uplink communication paths (8_U_1 to 8_U_M) and downlink communication paths (8_D_M to 8_D_1) extending from the battery system control unit 3 to the M-th voltage measuring module 2_M as the highest potential end are provided.

Each of battery voltage monitoring ICs 1_1 to 1_M has an output switching circuit 10_U, a communication signal input pin 5_U, and a communication signal output pin 4_U for uplink communication and also has an output switching circuit 10_D, a communication signal input pin 5_D, and a communication signal output pin 4_D for downlink communication. The output switching circuit 10_U for uplink communication and the output switching circuit 10_D for downlink communication are controlled so as to be adapted to the uplink and downlink by a mode determination circuit 20.

By employing the loopback communication in place of the ring network communication, particularly, in a register read command, a battery voltage monitoring IC 1 designated as an object to be accessed can respond by itself without waiting for a response from the post stage. In addition, the signal potential converting element 9 can be made unnecessary.

Third Embodiment <Auto Addressing>

Figure 4:
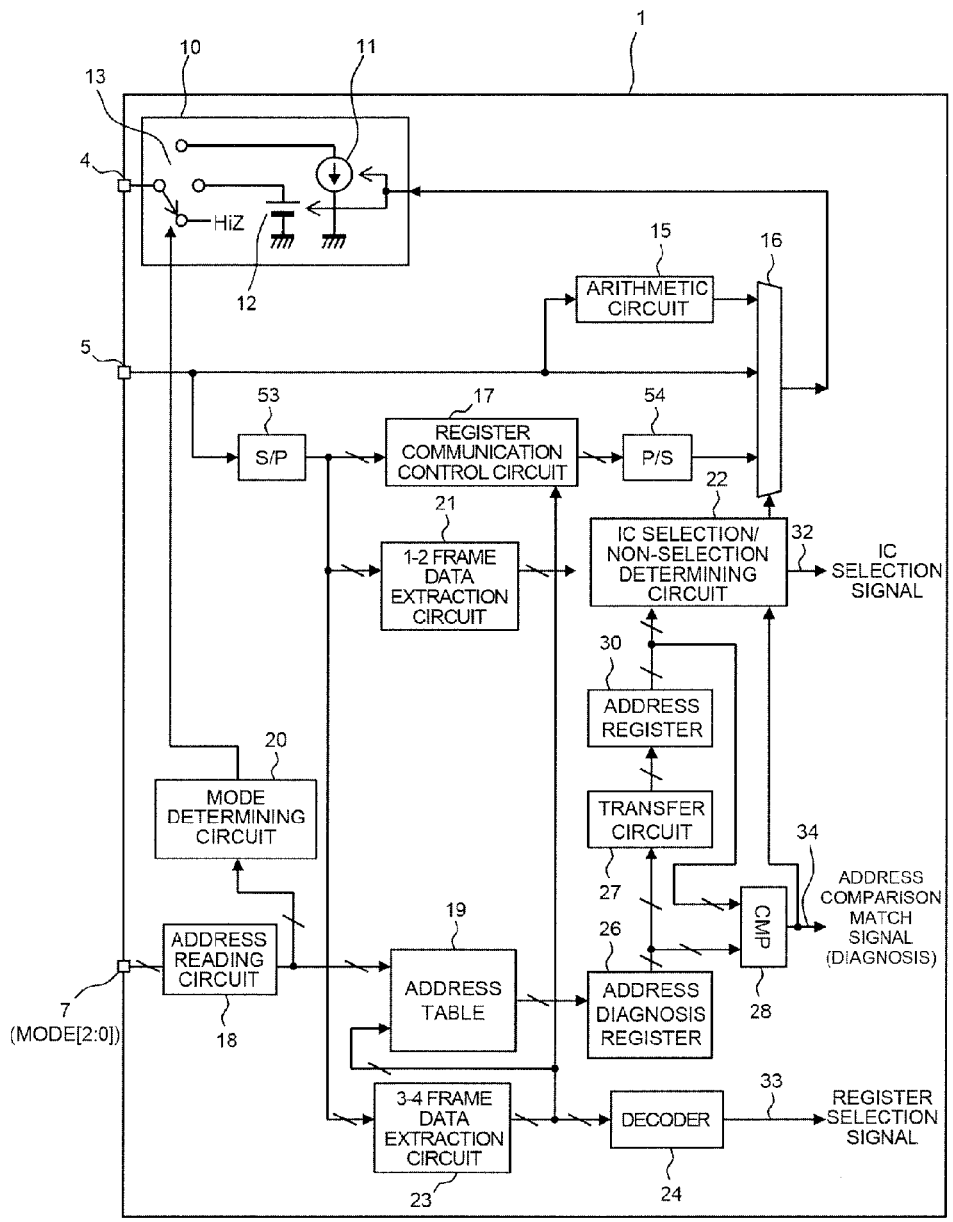
FIG. 4 is a block diagram illustrating a configuration example of a battery voltage monitoring IC (auto addressing) according to a third embodiment.

FIG. 4 is a block diagram illustrating a configuration example of a battery voltage monitoring IC (auto addressing) according to a third embodiment. In the battery voltage monitoring IC (pin addressing) according to the first embodiment, all of placement addresses are set by the address setting pin 6. In the third embodiment, only information of disposing the IC at the highest potential end, the lowest potential end, or an intermediate position is set by the mode setting pin 7.

Figure 7:
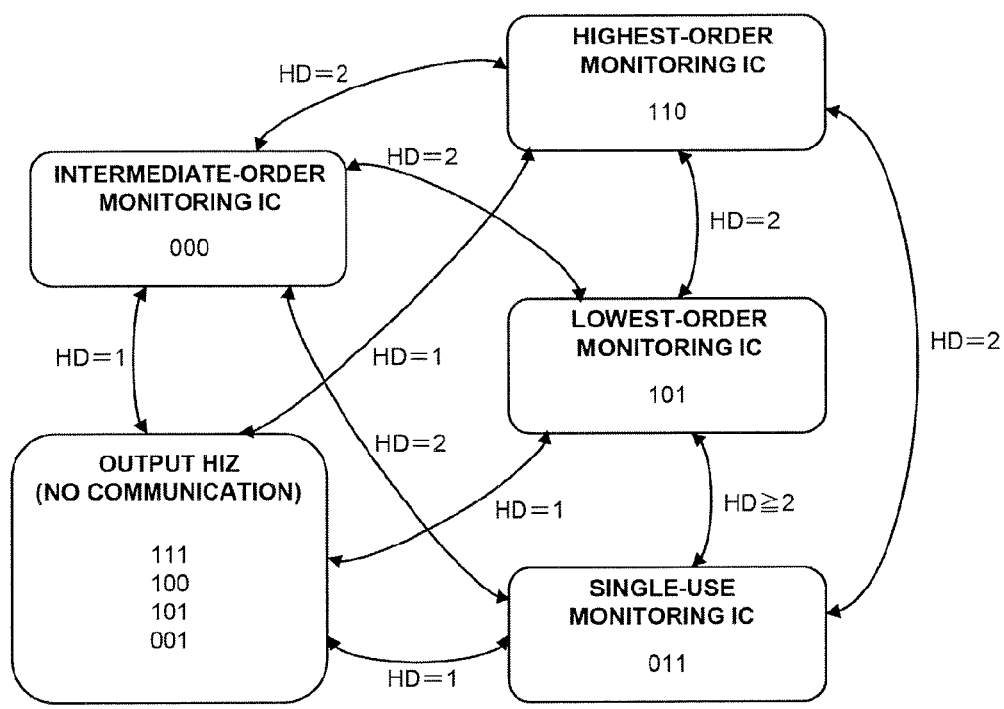
FIG. 7 is an explanatory diagram expressing Hamming distances of codes which are set in mode setting pins in the battery voltage monitoring device according to the third embodiment.

FIG. 7 is an explanatory diagram expressing Hamming distances of codes which are set in mode setting pins 7 in the battery voltage monitoring device according to the third embodiment. To the battery voltage monitoring IC 1 at the highest order disposed in the highest potential pin 93, b'110 is given as the placement address. Further, b'101 is given to the battery voltage monitoring IC 1 at the lowest order disposed in the lowest potential pin 94. When the placement address of the battery voltage monitoring IC at an intermediate position between the highest and lowest orders is b'000, the Hamming distance of the placement address of each of the battery voltage monitoring IC at the highest order and the battery voltage monitoring IC at the lowest order becomes 2 or larger. Further, in the case of singularly using a battery voltage monitoring IC, it is sufficient to assign the placement address b'011. When the state of the mode setting pin 7 is a placement address which is not assigned as any of the addresses of the battery voltage monitoring ICs at the highest, lowest, and intermediate orders and the address of the singular-use battery voltage monitoring IC, the output is set to high impedance to interrupt the communication path (no communication). The placement address having the Hamming distance of 1 from any of the addresses of the battery voltage monitoring ICs at the highest, lowest, and intermediate orders and the singular-use battery voltage monitoring IC is a placement address at which the output has to be always controlled to HiZ. It is characterized that a plurality of battery voltage monitoring ICs at intermediate level may exist and the placement addresses to be set for the ICs are the same value.

In the first embodiment, the example in which eight battery voltage monitoring ICs can be identified is illustrated in FIG. 5, and the number of address setting pins 6 at this time is five (pins). Each time the number of battery voltage monitoring ICs 1 is doubled, the number of the address setting pins 6 is increased by one. On the other hand, in the second embodiment, the number of mode setting pins 7 is three regardless of the number of the battery voltage monitoring ICs.

With the configuration, the number of pins to be provided for the battery voltage monitoring IC can be suppressed.

On the other hand, in the first embodiment, as illustrated in FIG. 6, chip addresses stored in the address register are calculated on the basis of only the setting information of the address setting pin 6 and set in the address register 30. However, the number of mode setting pins 7 is only three regardless of the number of the battery voltage monitoring ICs, so that unique addresses cannot be set in all of the battery voltage monitoring ICs from only the information. Consequently, IC addresses to be stored in the address register 30 are given by communication using a daisy chain in addition to the setting information of the mode setting pins 7.

In the column of the addressing mode in FIG. 16, an example of a frame format of daisy chain communication for setting IC addresses in the address register 30 is illustrated. The first and second frames are chip address frames like in the normal mode. In the normal mode, at least one IC is an object to be accessed. On the other hand, the first and second frames in the addressing mode are constructed by data which does not designate any IC as an object to be accessed. Since it is obvious that all of address registers are objects to be accessed in the addressing mode, by the chip address frames constructed by the data which does not designate any IC as an object to be accessed, the addressing mode can be detected.

In such a manner, without adding the kind of a frame format and the number of frames, the addressing mode can be added to the normal mode.

To the third and fourth frames subsequent to the first and second frames expressing the addressing mode, an IC address value to be set in the battery voltage monitoring IC 1 at the first stage is given. On the basis of the value, the battery voltage monitoring IC 1 at the first stage sets the address register 30, performs a predetermined arithmetic operation, and transmits the resultant data to the battery voltage monitoring IC at the next stage.

In FIG. 4, the values of the third and fourth frames extracted by the register address frame extracting circuit 23 are written into an address diagnosis register 26 via the address table 19 and, after that, transferred to the address register 30 via a transfer circuit 27. On the basis of the values designated in the third and fourth frames of the of the daisy chain communication, the address register 30 is set. On the other hand, the values of the third and fourth frames are subjected to a predetermined arithmetic process by an arithmetic circuit 15, and the resultant values are output via the output selection circuit 16 and the output switching circuit 10 from the communication signal output pin 4 and transferred to the monitoring IC at the next stage. Also in the monitoring IC at the next stage, the address register 30 is set by similar operations. Since the predetermined arithmetic process is performed, the value of an IC address to be set can be made different from that at the first stage. Further, even in the case where a value is transferred to multiple stages and addresses are set, by properly selecting the kind of the arithmetic process, IC addresses unique to all of the monitoring ICs can be set.

FIG. 8 is an explanatory diagram expressing an example of address tables of a battery voltage monitoring IC (auto addressing) according to the third embodiment. The mode setting pins are set in only three modes of b'110 at the highest level, b'101 at the lowest level, and b'000 at an intermediate level. The values set in the address registers can be made peculiar values from b'11111 at the lowest level to b'10000 at the highest level.

Figure 9:
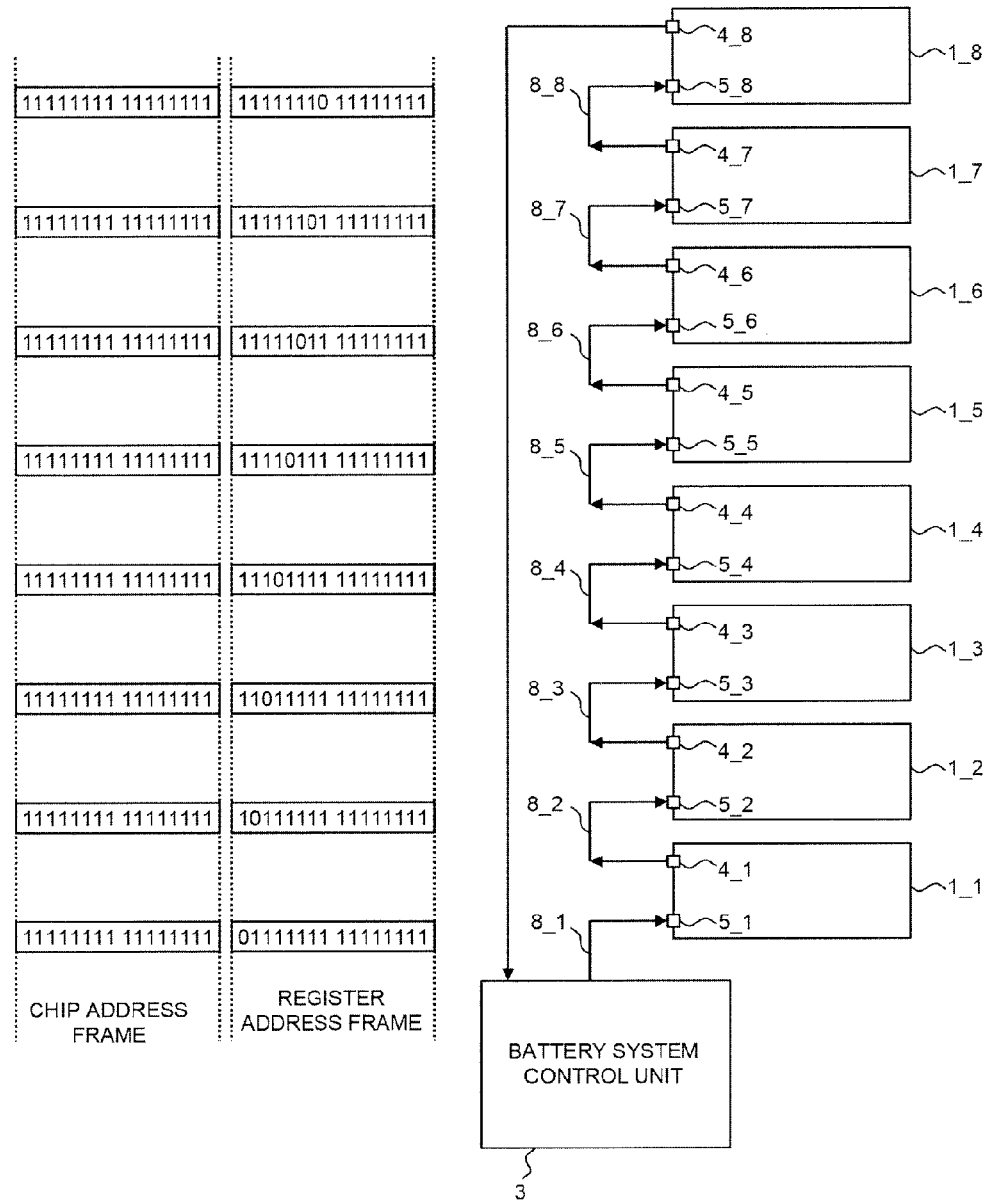
FIG. 9 is an explanatory diagram illustrating operations of automatic address setting in auto addressing.

FIG. 9 is an explanatory diagram illustrating operations of automatic address setting in auto addressing. Operations that the chip address frames constructed by the first and second frames and the register address frames constructed by the third and fourth frames illustrated in FIG. 16 are sequentially transferred to the eight battery voltage monitoring ICs 1_1 to 1_8 are schematically illustrated. It is assumed that the chip address frame indicates one battery monitoring IC by one bit, and b'0 indicates an object to be accessed. Since the chip address frames are constructed by total 16 bits of the first and second frames, they can be used in a daisy chain in which maximum 16 ICs are coupled. In FIG. 9, for simplification, a daisy chain made by eight ICs is illustrated. Since all of the chip address frames is made by 1, there is no IC selected in the normal mode, and an addressing mode is designated. The chip address frames of the same value (all of the values are 1) are sequentially transferred to all of the ICs. The battery system control unit 3 transmits a register address frame of b'01111111, 11111111 to the battery voltage monitoring IC 1_1 at the first stage. The battery voltage monitoring IC 1_1 at the first stage sets the IC address b'11111 corresponding to b'01111111, 11111111 in the register address frame into the address register 30 with reference to the address table illustrated in FIG. 8, shifts the register address frame by one bit by the arithmetic circuit 15 to change the frame to b'10111111, 11111111, and transmits the changed frame to the battery voltage monitoring IC 1_2. Hereinafter, the battery voltage monitoring ICs 1_2 to 1_7 set the values of the address register on the basis of the received register address frame and transmit a register address frame obtained by shifting the set register address frame by one bit to the next stage.

In such a manner, even when an IC address is not set, an IC address can be set from the outside, and the number of pins for designating an IC address can be suppressed to the minimum.

Figure 10:
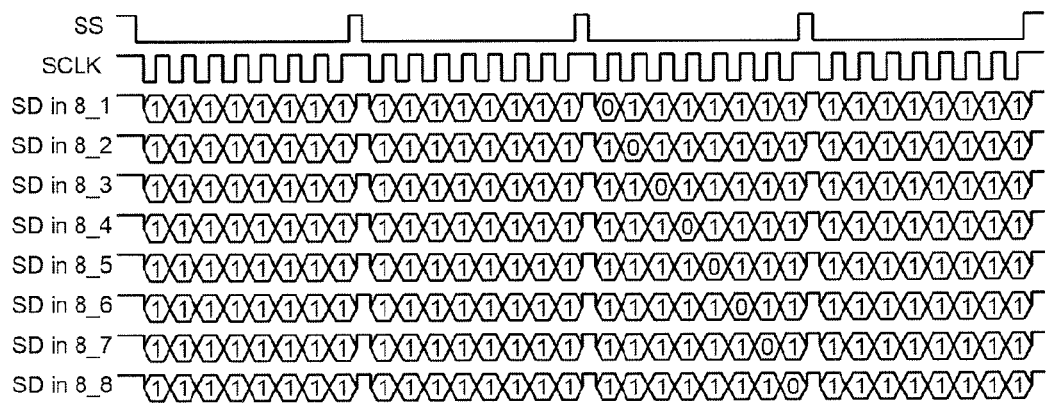
FIG. 10 is a timing chart illustrating operations of automatic address setting in auto addressing (bit shifting).

FIG. 10 is a timing chart illustrating operations of automatic address setting in auto addressing (bit shifting). In the example illustrated in FIG. 9, the bit shifting is performed as the arithmetic operation on a register address frame. As illustrated in the timing chart of FIG. 10, it is sufficient to perform the bit shifting synchronously with SCLK.

In such a manner, without converting the values of the register address frame input from the communication signal input pin 5 to parallel signals, the values of a new register address frame to be transmitted to the post stage can be calculated. Further, both of a chip address frame and a register address frame can be transmitted to the post stage without delay in a frame period unit.

Figure 11:
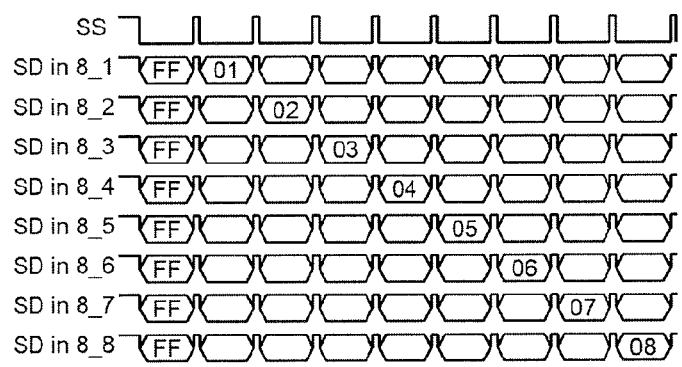
FIG. 11 is a timing chart illustrating operations of automatic address setting in auto addressing (increment).

FIG. 11 is a timing chart illustrating operations of automatic address setting in auto addressing (increment). It illustrates an example of the case of performing an arithmetic operation on a register address frame by the arithmetic circuit 15 by increment. To perform increment, a register address frame is once converted to a parallel value, 1 is added to the parallel value, after that, the resultant value is returned to a serial value again, and the serial value is transmitted to the next stage. Since serial-parallel conversion has to be executed after all of data is prepared, delay of one frame cycle occurs. FIG. 11 illustrates changes by frame cycle indicated by SS without depicting SCLK. Although it takes time until setting of the address register 30 is completed in all of the monitoring ICs 1_1 to 1_8, the register address frame is sequentially incremented, so that addresses can be set in number of monitoring ICs with the small number of bits. For example, by a register address frame of eight bits, address setting can be performed in 256 monitoring ICs.

Consequently, adjacent values are sequentially given as IC address values to adjacent semiconductor devices (battery voltage monitoring ICs) (1_1 to 1_M), so that the code efficiency can be increased (a number of addresses can be expressed with the small number of bits).

Fourth Embodiment <Address Register Diagnosis>

Address register diagnosis will be described. By re-transmitting the same command as that in the auto addressing described in the third embodiment, a diagnosis to check whether there is an unintended change in a value or not in a set address register, that is, the presence/absence of occurrence of a failure can be performed.

As described in the third embodiment, in the battery voltage monitoring IC 1, as illustrated in FIG. 4, the values of the third and fourth frames extracted by the register address frame extraction circuit 23 are written into the address diagnosis register 26 via the address table 19 and, after that, transferred to the address register 30 via the transfer circuit 27. On the basis of the values designated in the third and fourth frames in the daisy chain communication, the address register 30 is set. An IC address to be set on the basis of the register address frame is temporarily stored in the address diagnosis register 26. At the time point, the IC address set in the address register 30 is compared with the IC address to be set by a comparison circuit 28. The result of the comparison is output as an address comparison match signal (diagnosis) 34.

By inputting again an auto addressing command to set the same IC address as that in the initial setting, it can be used for a diagnosis to check whether the same IC address as the IC address to be set is set or not. Since the command is the same, at the time of the initial setting, a result of mismatch is output. At the time of the initial setting, the battery system control unit 3 issuing a command may ignore the result of mismatch. It is similarly performed in the case of resetting or a setting change. In the case where the result of mismatch is obtained when a result of match is expected, occurrence of a failure in an address register can be diagnosed. A status register may be provided to store the result of match or mismatch. After issuing an auto addressing command, it is sufficient for the battery system control unit 3 to read and confirm the result in the status register.

In the case of mismatch, an interrupt signal may be generated. Since an interrupt signal is output from each of the monitoring ICs, the monitoring ICs may be coupled to the battery system control unit 3 in a 1:1 manner or via a common bus. In the battery voltage monitoring system, however, the potentials at which the monitoring ICs operate are different. Consequently, both in the case of 1:1 coupling and in the case of coupling via the common bus, a number of isolating elements (isolators) are necessary. It is therefore more preferable to construct a communication by a daisy chain like in the communication signal line 8.

Figure 12:
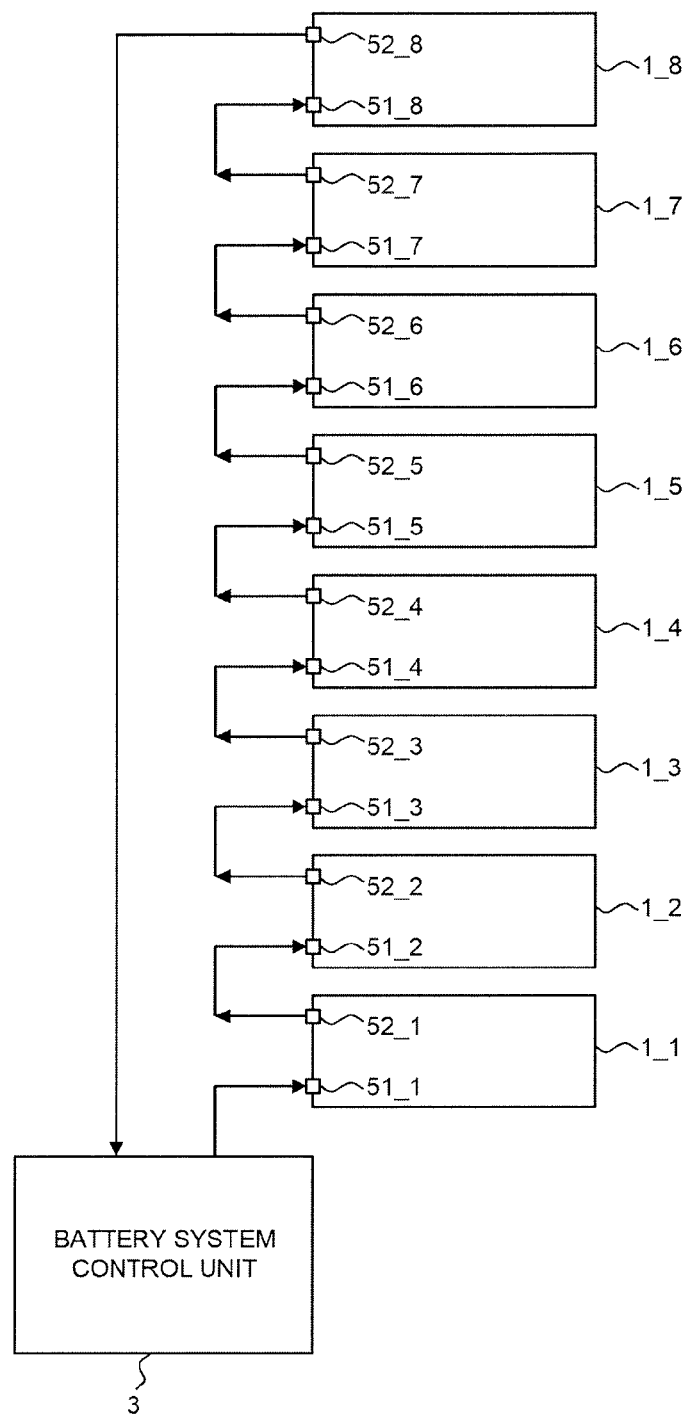
FIG. 12 is a block diagram of a battery voltage monitoring device having an interrupt signal communication constructed by a daisy chain.

FIG. 12 is a block diagram of a battery voltage monitoring device having an interrupt signal communication constructed by a daisy chain. Each of the battery voltage monitoring ICs 1_1 to 1_8 has an interrupt output pin 52 and an interrupt input pin 51. To the interrupt output pin 52, like the communication signal output pin 4, the output switching circuit 10 controlled by the mode determining circuit 20 is coupled. In the case of a failure, for example, by switching to high impedance, communication can be interrupted. A relatively minor failure can be notified by an interrupt signal to the battery system control unit 3 and recovered. In the case of a serious failure, however, to avoid serious influence, the communication can be interrupted promptly.

FIG. 12 illustrates an example of ring network communication. Although there is a case that a path from the battery voltage monitoring IC 1_8 at the highest order to the battery system control unit 3 needs the isolating element (isolator) 9 depending on the potential difference, the isolating element (isolator) 9 is not illustrated. Although the daisy chain of the loopback communication similar to that in FIG. 2 can be also configured, in this case, two systems for uplink and downlink have to be provided for each of the interrupt output pin 52 and the interrupt input pin 51. To transmit an interrupt signal, a transmission main body is a battery voltage monitoring IC 1 in which an interrupt occurs. The battery voltage monitoring IC 1 in which an interrupt occurs can transmit an interrupt signal to the battery system control unit 3 by a method of issuing a write command designating the battery system control unit 3 by a chip address frame. A transmission method and a competition arbitrating method when interrupts occur from a plurality of battery voltage monitoring ICs can be realized by following a known communication method using the daisy chain communication.

By generating an interrupt, occurrence of a failure can be promptly and reliably notified to the battery system control unit. By employing the daisy chain configuration for transmission of an interrupt signal, the number of communication signal lines is suppressed, and the number of use of the isolating elements (isolators) can be suppressed.

Fifth Embodiment <Status Register Batch Reading>

Figure 13:
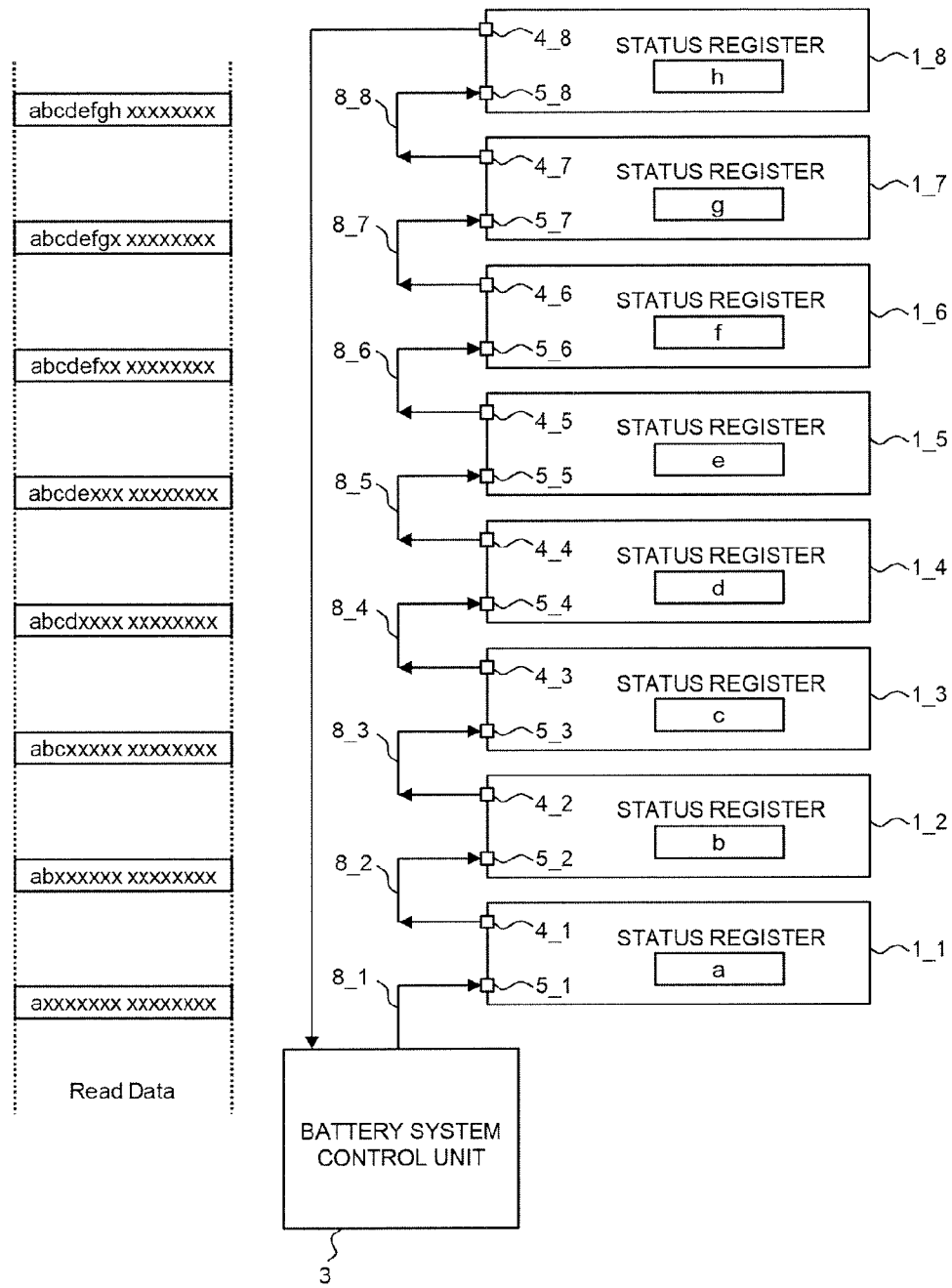
FIG. 13 is an explanatory diagram illustrating an operation of status register batch reading in a test mode.
Figure 14:
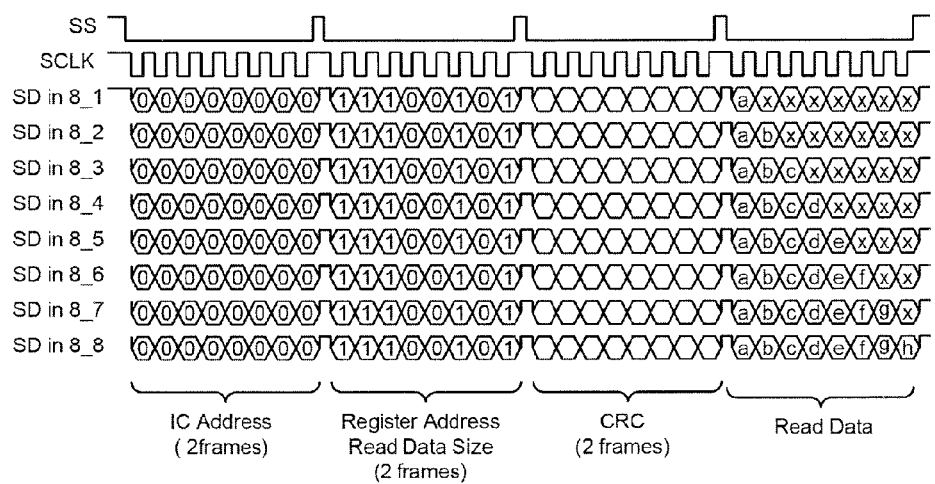
FIG. 14 is a timing chart illustrating an operation of status register batch reading in a test mode.

FIG. 13 is an explanatory diagram illustrating an operation of status register batch reading in a test mode. FIG. 14 is a timing chart illustrating an operation of status register batch reading in a test mode.

The battery voltage monitoring IC 1 is provided with various status registers. The statuses include, for example, a status indicating a failure of a unit cell to be monitored, a CRC error status in the case where CRC of a command received in the daisy chain communication is calculated and an error is detected, and an error status indicative of an error in the case of performing a diagnosis on the address register described in the above-described fourth embodiment. In the case where any of the above-described errors occurs, as described in the fourth embodiment, the occurrence of the error can be notified to the battery system control unit 3 by an interrupt. However, there are many cases that the cause of the error cannot be notified. Since priority in notification of an interrupt is placed on promptness, in many cases, a simple communication protocol is used and the amount of information which can be transmitted is limited. The battery system control unit 3 to which the occurrence of the error is notified by an interrupt reads the information of the status register to check the cause of the error.

In the status register batch reading in the fifth embodiment, by issuing one command, the data in the status registers is read from all of the battery voltage monitoring ICs which is daisy-chain coupled. A frame format can be configured as illustrated in the test mode box in FIG. 16.

A chip address frame is constructed by the first and second frames, and the third frame indicates a read command and designates the address of a status register to be read. In the normal mode, to avoid competition of read data, only one monitoring IC can be designated in the chip address frame in a read command. In the test mode, all of monitoring ICs are simultaneously designated as objects to be accessed even in a read command. Read data is output to a read data frame constructed by the seventh and eighth frames.

FIG. 13 illustrates the status register batch reading operation, in a daisy chain constructed by eight battery voltage monitoring ICs. It is assumed that eight ways "a" to "h" of status information are stored in status registers of the same address in the eight battery voltage monitoring ICs 1_1 to 1_8. In practice, the status information is one bit of two ways, which is expressed by 1 or 0. a=1 or 0, b=1 or 0, . . . h=1 or 0. In FIG. 13, read data frames output from the battery voltage monitoring ICs 1_1 to 1_8 are written. The information "a" of the status register is written in the first bit in the battery voltage monitoring IC 1_1, and the resultant frame is transmitted to the battery voltage monitoring IC 1_2 at the next stage. The battery voltage monitoring IC 1_2 does not change the first bit of the received read data frame, writes the information "b" of the status register of itself in the second bit, and transmits the resultant frame to the battery voltage monitoring IC 1_3 at the next stage. Hereinafter, each of the subsequent battery voltage monitoring ICs writes the information of the status register of itself in the bit position determined on the basis of the IC address of itself in the received read data frame, and transmits the resultant frame to the battery voltage monitoring IC at the next stage. The status information obtained via all of the eight battery voltage monitoring ICs 1_1 to 1_8 is received in a lump by the battery system control unit 3.

FIG. 14 is a timing chart of the operation. In the read data frames, new status information is sequentially additionally written synchronously with SCLK. As a whole, no delay in the frame unit occurs.

In such a manner, the status information can be read in a lump (simultaneously and in parallel) from the plurality of semiconductor devices (battery voltage monitoring ICs) (1_1 to 1_M).

Although the invention achieved by the inventors herein has been concretely described on the basis of the embodiments, obviously, the invention is not limited to the embodiments but can be variously changed without departing from the gist.

For example, the present invention can be effectively applied to a voltage monitoring device of a power supply which is not only an assembled battery in which secondary cells such as lithium-ion cells, nickel-hydride cells, or fuel cells are serially coupled in multiple stages but also an assembled battery made by primary cells coupled in series or, for example, a power supply in which large-amount capacitors such as electric double-layer capacitors or lithium-ion capacitors are serially coupled in multiple stages.

INDUSTRIAL APPLICABILITY

The present invention relates to the battery voltage monitoring device and the semiconductor device used for the same and, particularly, can be widely applied to fail-safe design in the communication of the battery voltage monitoring IC.

EXPLANATION OF REFERENCE NUMERALS 1, 1_1 TO 1_M BATTERY VOLTAGE MONITORING IC
2, 2_1 TO 2_M BATTERY VOLTAGE MONITORING MODULE (VOLTAGE MEASURING MODULE)
3 BATTERY SYSTEM CONTROL UNIT
4, 4_1 TO 4_M SDO (COMMUNICATION SIGNAL OUTPUT PIN)
5, 5_1 TO 5_M SDI (COMMUNICATION SIGNAL INPUT PIN)
6 ADDRESS SETTING TERMINAL
7 MODE SETTING TERMINAL
8_1 TO 8_M+1 COMMUNICATION LINE
9 ISOLATING ELEMENT (ISOLATOR)
10 OUTPUT SWITCHING CIRCUIT
11 CURRENT OUTPUT CIRCUIT
12 VOLTAGE OUTPUT CIRCUIT
13 SWITCH
15 ARITHMETIC CIRCUIT

16 OUTPUT SELECTION CIRCUIT
17 REGISTER COMMUNICATION CONTROL CIRCUIT
18 ADDRESS READING CIRCUIT
19 ADDRESS TABLE
20 MODE DETERMINATION CIRCUIT
21 CHIP ADDRESS FRAME EXTRACTION CIRCUIT
22 IC SELECTION/NON-SELECTION DETERMINATION CIRCUIT
23 REGISTER ADDRESS FRAME EXTRACTION CIRCUIT
24 REGISTER ADDRESS DETERMINATION CIRCUIT
25 STATUS REGISTER
26 ADDRESS DIAGNOSIS REGISTER
27 TRANSFER CIRCUIT
28 COMPARISON CIRCUIT
30 ADDRESS REGISTER
31 IC ADDRESS SIGNAL
32 IC SELECTION SIGNAL
33 REGISTER SELECTION SIGNAL
34 ADDRESS COMPARISON MATCH SIGNAL (DIAGNOSIS)
51 INTERRUPT INPUT PIN
52 INTERRUPT OUTPUT PIN
53 SERIAL-PARALLEL CONVERSION CIRCUIT
54 PARALLEL-SERIAL CONVERSION CIRCUIT
91 POSITIVE ELECTRODE OF ASSEMBLED BATTERY
92 NEGATIVE ELECTRODE OF ASSEMBLED BATTERY
93 HIGHEST-POTENTIAL END OF UNIT CELL GROUP TO WHICH M PIECES OF BATTERY MONITORING MODULES ARE COUPLED
94 LOWEST-POTENTIAL END OF UNIT CELL GROUP TO WHICH M PIECES OF BATTERY MONITORING MODULES ARE COUPLED

What is claimed is:

1. A semiconductor device disposed in each of M pieces (M is an integer of three or larger) of unit cell groups in a plurality of unit cells configuring an assembled battery by being serially coupled in multiple stages between a positive electrode and a negative electrode, the M groups existing from a first tap close to the positive electrode and a second tap close to the negative electrode, and the semiconductor device monitoring the unit cells belonging to the group, comprising:
a communication signal pin;
a placement setting pin group for designating, by a binary code, a unit cell group to which the placement setting pin group is coupled, in the M pieces of unit cell groups;
an output switching circuit capable of switching between output and interruption of a signal from the communication signal pin; and
a mode determining circuit for controlling the output switching circuit on the basis of a state of the placement setting pin group,
wherein a state of the placement setting pin group for designating coupling to the first tap is expressed by a first code, a state of the placement setting pin group for designating coupling to the second tap is expressed by a second code, and
wherein the mode determining circuit interrupts an output from the communication signal pin by the output switching circuit when the state of the placement setting pin group corresponds to a Hamming distance of 1 from the first code or the second code.

2. The semiconductor device according to claim 1,
wherein the output switching circuit can switch the communication signal pin among driving by a voltage source, driving by a current source, and setting to high impedance, and
wherein the mode determining circuit drives the communication signal pin by the voltage source by the output switching circuit when the state of the placement setting pin group matches the first code, drives the communication signal pin by the current source by the output switching circuit when the state of the placement setting pin group matches the second code, and sets the communication signal pin to high impedance by the output switching circuit when the state of the placement setting pin group is the Hamming distance of 1 from the first code or the second code.

3. The semiconductor device according to claim 1, further comprising an address register, wherein the placement setting pin group is an address setting pin, and the address register is set on the basis of a state set in the address setting pin.

4. The semiconductor device according to claim 1, further comprising an address register and a communication signal input pin,
wherein the communication signal pin is a communication signal output pin,
wherein the placement setting pin group is a mode setting pin, and
wherein the address register is set on the basis of a state which is set in the mode setting pin and a value input from the communication signal input pin.

5. The semiconductor device according to claim 4, further comprising an arithmetic circuit, an output selection circuit, and a register communication control circuit,
wherein the output selection circuit can select either performing an arithmetic operation by the arithmetic circuit on a signal input from the communication signal input pin and outputting the resultant signal to the communication signal output pin or outputting a signal input from the communication signal input pin as it is to the communication signal output pin,
wherein when a register access command designating an IC address is input from the communication signal input pin, an internal register can be accessed by the register communication control circuit on the basis of the register access command, and
wherein when an IC address setting command and an IC address value are input from the communication signal input pin, the address register is set on the basis of the IC address value, and the output selection circuit selects the signal subjected to the arithmetic operation by the arithmetic circuit for an IC address value input from the communication signal input pin and outputs it to the communication signal output pin.

6. The semiconductor device according to claim 5, wherein a signal which is input to the communication signal input pin is a bit serial signal, a signal which is output from the communication signal output pin is a bit serial signal, and the arithmetic operation performed by the arithmetic circuit is bit shift.

7. The semiconductor device according to claim 5, wherein a signal which is input to the communication signal input pin is a bit serial signal, a signal which is output from the communication signal output pin is a bit serial signal, and the arithmetic circuit increments the address value which is input in association with the IC address setting command, and outputs the resultant value from the communication signal output pin.

8. The semiconductor device according to claim 5, wherein when an IC address setting command and an IC address value are input from the communication signal input pin, a value set in the address register on the basis of the IC address value and a value stored in the address register are compared.

9. The semiconductor device according to claim 1, further comprising an interrupt output pin, wherein when it is detected by the mode determining circuit that a state of the placement setting pin group corresponds to a Hamming distance of 1 from the first code or the second code, an interrupt signal is output from the interrupt output pin.

10. A semiconductor device disposed in each of a plurality of unit cell groups in a plurality of unit cells which construct an assembled battery by being serially coupled in multiple stages between a positive electrode and a negative electrode, to which an IC address is given, and the semiconductor device monitoring the unit cells belonging to the group, comprising:
    an address register for holding the IC address given;
    a communication signal input pin and a communication signal output pin;
    a chip address determining circuit outputting an IC selection signal on the basis of data of a chip address frame which is input from the communication signal input pin;
    a register address determining circuit outputting a register selection signal on the basis of data of a register address frame which is input from the communication signal input pin; and
    a status register which can be designated by the register selection signal,
    wherein when selected by the IC selection signal, data of a bit position corresponding to an IC address stored in the address register, of a register read data frame which is input from the communication signal input pin is updated by being replaced with status information of the status register designated by the register selection signal, and the updated register read data frame is transmitted from the communication signal output pin.

11. The semiconductor device according to claim 10, wherein the chip address determining circuit outputs the IC selection signal on the basis of the value of a bit position specified by an IC address stored in the address register in the chip address frame.

12. The semiconductor device according to claim 10, further comprising a mode setting pin,
    wherein the status register can store an IC address error and, when the chip address frame has a predetermined value and a value which is set in the address register on the basis of the value of the register address frame and a value stored in the address register are different from each other, the IC address error is stored in the status register.

13. A battery voltage monitoring device comprising a battery system control unit and, for each of M pieces (M is an integer of three or larger) of unit cell groups in a plurality of unit cells which construct an assembled battery by being serially coupled in multiple stages between a positive electrode and a negative electrode, the M pieces of unit cell groups existing from a highest potential end close to the positive electrode to a lowest potential end close to the negative electrode, M pieces of voltage measuring units from a first voltage measuring unit to an Mth voltage measuring unit sequentially disposed from the lowest potential end to the highest potential end, the voltage measuring units being identified by first to Mth addresses on the basis of the disposition,
    wherein the battery system control unit and the first to M-th voltage measuring units are coupled by a daisy chain,
    wherein the battery system control unit can access the first to Mth voltage measuring units by communication using the daisy chain,
    wherein each of the first to Mth voltage measuring units has a placement setting pin group for designating, by a binary code, a unit cell group to which the placement setting pin group is coupled, in the M pieces of unit cell groups,
    wherein a state of the placement setting pin group for designating coupling to the unit cell group at the highest potential end is expressed by a first code, a state of the placement setting pin group for designating coupling to the unit cell group at the lowest potential end is expressed by a second code, and
    each of the first to Mth voltage measuring units interrupts the communication using the daisy chain when the state of the placement setting pin group corresponds to a Hamming distance of 1 from the first code or the second code.

14. The battery voltage monitoring device according to claim 13,
    wherein the first voltage measuring unit and the battery system control unit are coupled via a first communication line, the Mth voltage measuring unit and the battery system control unit are coupled via a signal potential converting element by an M+1-th communication line, the first and second voltage measuring units are coupled via a second communication line, the (M−1) th voltage measuring unit and the Mth voltage measuring unit are coupled by an Mth communication line,
    wherein the first voltage measuring unit drives the second communication line by a current source when the set state of the placement setting pin group is equal to the second code, and sets the second communication line to high impedance when the set state of the placement setting pin group is equal to the Hamming distance of 1 from the second code, and
    wherein the M-th voltage measuring unit drives the signal potential converting element by a voltage source when the set state of the placement setting pin group is equal to the first code, and sets the coupling to the signal potential converting element to high impedance when the set state of the placement setting pin group is equal to the Hamming distance of 1 from the first code.

15. The battery voltage monitoring device according to claim 13,
    wherein each of the first to M-th voltage measuring units further comprises an address register,
    wherein the placement setting pin group is an address setting pin, and the address register is set on the basis of the state which is set in the address setting pin.

16. The battery voltage monitoring device according to claim 13, wherein each of the first to M-th voltage measuring units further comprises an address register, the placement setting pin group is a mode setting pin, and the address register is set on the basis of the state which is set in the mode setting pin and a value designated by communication using the daisy chain.

17. The battery voltage monitoring device according to claim 16, wherein the communication using the daisy chain is serial communication, the battery system control unit can issue a command made of a plurality of bits, wherein the command includes a chip address frame including M bits, which can independently designate any of the first to M-th voltage measuring units as an object to be accessed, wherein an address setting command in the command includes a chip address frame indicating that any of the first to M-th voltage measuring units is not an object to be accessed and a data frame indicative of an address value to be set in the first voltage measuring unit, wherein the first voltage measuring unit receives the address setting command and stores a value based on the value of the data frame into the address register, wherein the first voltage measuring unit replaces the received address setting command with a new address setting command including the received address frame and a new data frame obtained by performing a pre-determined arithmetic operation on the value of the data frame, and transmits the new address setting command to the second voltage measuring unit via the second communication line, and wherein each of the second to the (M−1)th voltage measuring units replaces the received address setting command with a new address setting command including the received address frame and a new data frame by a value obtained by performing the arithmetic operation on the value of the received data frame, and transmits the new address setting command to a voltage measuring unit at the next stage.

18. The battery voltage monitoring device according to claim 17, wherein the arithmetic operation is a bit shift of a value of a received data frame.

19. The battery voltage monitoring device according to claim 17, wherein the arithmetic operation is increment of the value of a received data frame.

20. The battery voltage monitoring device according to claim 17, wherein on receipt of the address setting command, each of the first to (M−1)th voltage measuring units compares a value which is set in the address register on the basis of the value of the data frame with the value stored in the address register.

* * * * *